US012141689B2

(12) United States Patent
Garcia Garcia

(10) Patent No.: US 12,141,689 B2
(45) Date of Patent: Nov. 12, 2024

(54) DATA COMPRESSION FOR A NEURAL NETWORK

(71) Applicant: NVIDIA Corporation, Santa Clara, CA (US)

(72) Inventor: David Rigel Garcia Garcia, North York (CA)

(73) Assignee: NVIDIA Corporation, Santa Clara, CA (US)

( * ) Notice: Subject to any disclaimer, the term of this patent is extended or adjusted under 35 U.S.C. 154(b) by 1280 days.

(21) Appl. No.: 16/357,146

(22) Filed: Mar. 18, 2019

(65) Prior Publication Data

US 2020/0302284 A1 Sep. 24, 2020

(51) Int. Cl.
*G06N 3/08* (2023.01)
*G06F 7/57* (2006.01)
*G06F 17/16* (2006.01)
*H03M 7/30* (2006.01)

(52) U.S. Cl.
CPC .............. *G06N 3/08* (2013.01); *G06F 7/57* (2013.01); *G06F 17/16* (2013.01); *H03M 7/702* (2013.01)

(58) Field of Classification Search
CPC .. G06N 3/08; G06N 3/063; G06F 7/57; G06F 17/16; G06F 7/483; G06F 7/544; G06F 5/012; G06F 7/556; H03M 7/702; H03M 7/24; H03M 7/70; H03M 7/30
See application file for complete search history.

(56) References Cited

U.S. PATENT DOCUMENTS

| 5,839,100 A * | 11/1998 | Wegener | H04B 14/068 704/265 |
| 7,698,285 B2 * | 4/2010 | Grosset | G06F 16/2264 707/999.1 |
| 2013/0018889 A1 * | 1/2013 | Jagmohan | H03M 7/3084 707/E17.11 |
| 2015/0139285 A1 * | 5/2015 | McGowan | H03M 7/30 375/219 |
| 2016/0239265 A1 * | 8/2016 | Duong | H03M 7/24 |
| 2017/0242614 A1 * | 8/2017 | Rao | H03M 7/6011 |

(Continued)

FOREIGN PATENT DOCUMENTS

| WO | WO-2016145371 A2 * | 9/2016 | ........... H04B 1/1661 |
| WO | 2017129325 A1 | 8/2017 | |

OTHER PUBLICATIONS

Communication Pursuant to Rule 69 EPC, mailed Sep. 28, 2020, European Patent Application No. 20161795.8, 2 pages.

(Continued)

*Primary Examiner* — Farley Abad
(74) *Attorney, Agent, or Firm* — Davis Wright Tremaine LLP

(57) ABSTRACT

Systems and methods for generating a representative value of a data set by first compressing a portion of values in the data set to determine a first common value and further compressing a subset of the portion of values to determine a second common value. The representative value is generated by taking the difference between the first common value and the second common value, wherein the representative value corresponds to a mathematical relationship between the first and second common values and each value within the subset of the portion of values. The representative value requires less storage than the first and second common values.

25 Claims, 12 Drawing Sheets

(56) References Cited

U.S. PATENT DOCUMENTS

2018/0157465 A1\* 6/2018 Bittner .................. G06F 7/52
2019/0042944 A1\* 2/2019 Nair .................... G06N 3/084
2019/0272333 A1 9/2019 Siddiqi et al.
2020/0210839 A1\* 7/2020 Lo .................. G06F 9/30025

OTHER PUBLICATIONS

Drumond et al., "Training DNNs with Hybrid Block Floating Point," 32nd Conference on Neural Information Processing Systems (NeurIPS '18), Dec. 2, 2018, 11 pages.
Extended European Search Report mailed Jul. 20, 2020, European Patent Application No. 20161795.8, 13 pages.
IEEE Computer Society, "IEEE Standard 754-2008 (Revision of IEEE Standard 754-1985): IEEE Standard for Floating-Point Arithmetic," The Institute of Electrical and Electronics Engineers, Inc., Aug. 29, 2008, 70 pages.
Wikipedia, "Arithmetic logic unit—Wikipedia," Dec. 4, 2018, retrieved Jul. 7, 2020, from https://en.wikipedia.org/w/index.php?title=Arithmetic_logic_unit&oldid=872026756, 8 pages.
Wikipedia, "Delta encoding," Mar. 24, 2018, retreived Jul. 9, 2020, from https://en.wikipedia.org/w/index.php?title=Delta_encoding&oldid=832279277, 5 pages.
Office Action for European Application No. 20161795.8, mailed Nov. 9, 2022, 8 pages.
Office Action for Chinese Application No. 202010192465.7, mailed Sep. 21, 2024, 13 pages.

\* cited by examiner

DATA COMPRESSION FOR A NEURAL NETWORK

BACKGROUND

There are various technical challenges involved in being able to compress and decompress data and further reducing the number of bits when storing compressed data to achieve a desired storage metric. Algorithms associated with determining compressed numerical representations for compressed data elements and further storing these compressed numerical representations (which are often represented by a large number of bits) can exceed or otherwise overwhelm storage capacity associated with a storage device. Moreover, the computational costs related to training neural networks are also affected due to the size of these numerical representations. Furthermore, numerical representations that require a large number of bits often cause complex issues related to transferring data within a device or between different devices given bandwidth limitations and/or restrictions in a computing environment.

BRIEF DESCRIPTION OF THE DRAWINGS

Various techniques will be described with reference to the drawings, in which.

DETAILED DESCRIPTION

Figure 1:
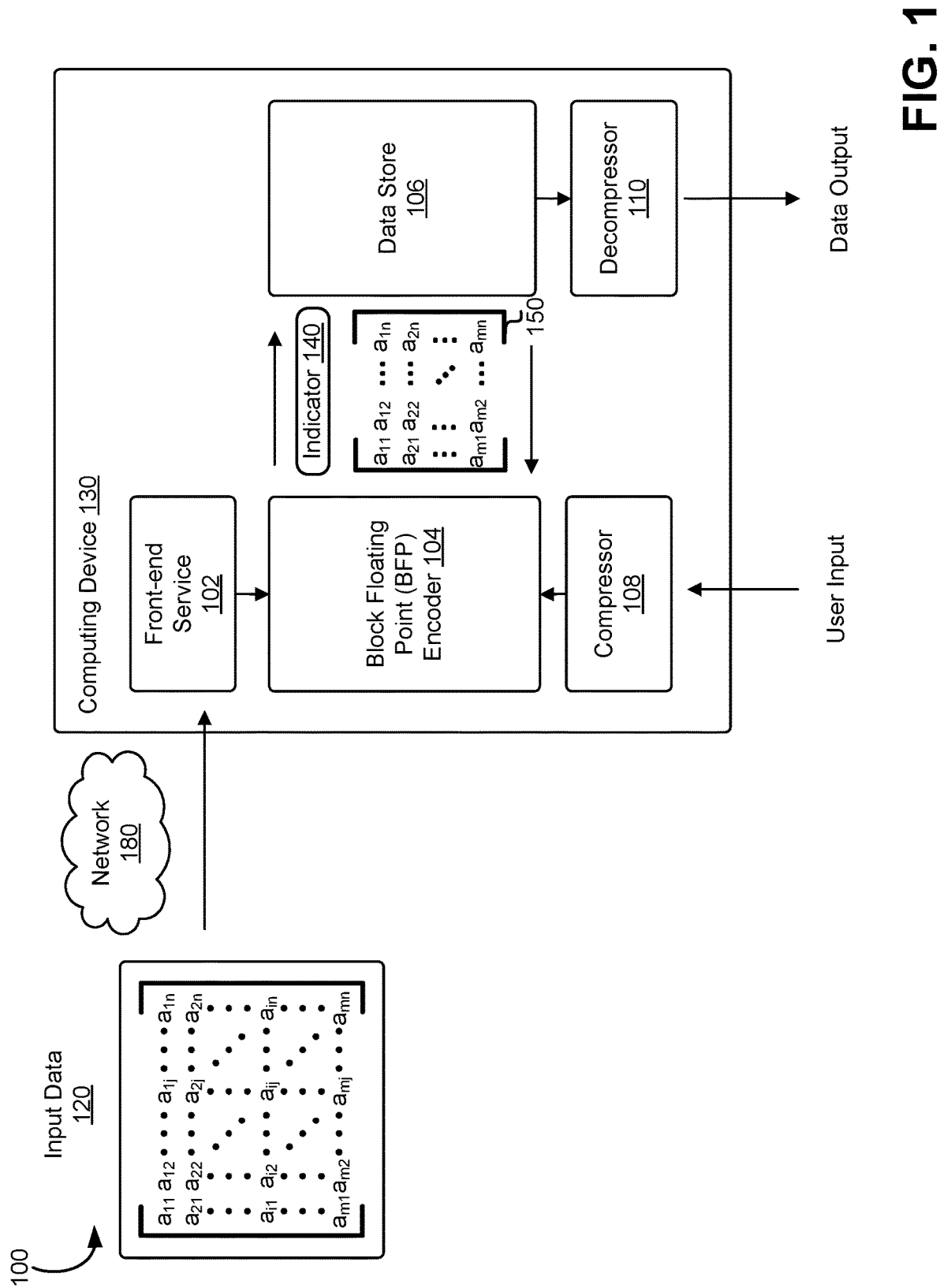
FIG. 1 illustrates a computing environment in which a block floating point (BFP) encoder is implemented to generate one or more compressed numerical representations, in accordance with an embodiment.

In an embodiment, systems and methods implemented in accordance with this disclosure are utilized to generate a compressed numerical representation in a data set that is simultaneously well-suited to represent activations, weights, and gradients in deep neural networks, and at the same time can be implemented efficiently in hardware. In particular, in an embodiment, the compressed numerical representation is amenable to an efficient implementation of matrix multiplications as these primarily constitute the bulk of the computational cost of training a neural network. In an embodiment, the compressed numerical representation comprises an integer or other numerical value but, in some embodiments, it comprises an indicator of a value, an indicator to determine the value, and/or an indicator of a mathematical relationship to determine a value.

That is, in an embodiment, systems and methods implemented in accordance with this disclosure are utilized to compress a data set in a multi-step process, where the entire data set is first compressed by finding a value that can be stored once instead of multiple times for each element in the data set. In an embodiment, individual subsets of the data set are then compressed in the same way to find (for each subset) a second value, then, instead of storing this second value, an indicator of how to get from the first value to the second value is stored. This indicator typically takes up less space (fewer bits) than the second value itself and thus is a more efficient way of storing values of the data set.

To put another way, in an embodiment, a plurality of values in a data set are received as a matrix with "m" rows and "n" columns, where each value (or scalar) of the matrix is represented by an ordinary floating point number (or binary value). A scalar is a computer representation that approximates the value of one real number in floating point format. In an embodiment, the plurality of values in a data set are received as a multidimensional tensor (e.g., 4-dimentioanl tensor). In an embodiment, a tensor is a multidimensional array of scalars, including but not limited to matrices of R×C elements. Each ordinary floating point number is represented by a sequence of bits where a portion of the bits (typically a single bit) indicates a sign, another portion of the bits represent an exponent, and another portion of the bits represent a mantissa. For example, in a 32-bit sequence where the sign is represented by a single bit "1," the exponent is represented by 8-bits "01111111," and the mantissa is represented by 23 bits "11000000000000000000000" would generate the binary value of "−1.11." Other representations in different formats for values may also be implemented besides floating point numbers (such as logarithmic number representations) as floating point numbers is just one embodiment described herein.

In an embodiment, the matrix is subdivided into a uniform grid of non-overlapping tiles of N×M scalars (e.g., 4×4 scalars) each. In an embodiment, each of the non-overlapping tiles that divide the matrix into a uniform grid are referred to as a submatrix (or block). These tiles may or may not be of the same size. Elements in a matrix are often tiled to improve locality in intermediate caching storage. More specifically, the matrix is divided by the weight matrices in tiles of a predefined size and share exponents within tiles. Tiling bounds the number of values that share exponents. In an embodiment, each block is compressed independently of each other by determining information common to the elements of the block that enables storing the entries in a way that utilizes fewer bits. This may be performed by subtracting from the exponent of each element of the block a value, such as the maximum exponent common to all elements in the block. Other ways of reducing the bits to store each element or achieve other advantages, such as extracting common bits, factoring, or otherwise may be used. In an embodiment, the maximum or common exponent value is referred to as "block_exp." As an illustrative example, in an embodiment, if each exponent in a block is at least n (n being positive integer), n may be subtracted from each element in the block so that each element in the block may be stored with fewer bits.

Subsequently, in an embodiment, each block is further subdivided into a uniform grid of non-overlapping sub-tiles of smaller P×Q scalars (e.g., 2×2 scalars). In an embodiment, each of these uniform grid of non-overlapping sub-tiles is referred to as a "quad." In an embodiment, each quad in a block is compressed by determining a value (or exponent value) common to all elements in the quad, such as performed in connection with compressing a block of the matrix as discussed above. In an embodiment, the common value (or common exponent value) of the quad is referred to as "quad_exp." In an embodiment, given that each quad belongs to the same block, the value of quad_exp is less than or equal to block_exp. Moreover, in an embodiment, as long as the block size of N×M is small enough, there exists a high probability that the difference between block_exp and max_exp will be sufficiently small to enable additional compression.

In an embodiment, rather than having the system to store quad_exp directly, a more efficient encoding is obtained by storing the difference (or an indicator of the difference) between quad_exp and block_exp. The difference in some instances, may be referred to as the per-quad exponent delta, the compressed numerical representation or the proxy (substitute for the quad_exp) that provides information to allow a system to determine the quad_exp from the block_exp. In an embodiment, this difference is represented as an unsigned integer with a predetermined amount of bits. In an embodiment, if the actual difference is greater than what can be represented in the predetermined amount of bits, the difference is saturated to a maximum representative value. However, in some embodiments, the difference or the difference value itself is not stored, but rather an indicator of a mathematical relationship, and/or an indicator to determine a mathematical relationship between quad_exp and block_exp and the values among all the scalars of the quad is determined and stored.

The techniques described herein are utilized to generate difference values or indicators that provide information to indicate a mathematical relationship between standard block-exponents. The presence of these difference values increases the dynamic range of values that can be supported within a submatrix (or block), while still having a lower memory overhead compared to having a separate exponent for each scalar. A wider dynamic range in turn means that the scalars within a submatrix (or block) can be represented with fewer mantissa bits than would be necessary for numerical stability if the difference values were not present. Thus, the storage space required to store these difference values are less than the amount of space required to store individual and separate exponents for each scalar.

In addition to providing a more efficient way of storing exponents, the techniques described herein conveniently allows for computing the transpose of a matrix easily, as the regular structure of both the submatrices (or blocks) and the quads means that transposing can be computed without any further rounding or quantization errors. Furthermore, by implementing the techniques described herein and with the amount of space saved, it will lead to approximately two times (2×) of higher end-to-end training perforce across a wide variety of neural networks and/or various Graphics Processing Units (GPUs).

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

FIG. 1 illustrates a computing environment 100 in which a block floating point (BFP) encoder 104 is implemented in a computing device 130 along with a front-end service 102, data store 106, compressor 108, and decompressor 110 to generate and store one or more compressed numerical representations. The one or more compressed numerical representations may be referred to as representative values, common exponent values, reference exponents, or difference values. In an embodiment, the one or more compressed numerical representations is simply referred to as indicators 140 for a data set, in accordance with an embodiment. In an embodiment, the computing environment 100 is a representation associated with a neural network, where the neural network uses the compressed numerical representations such that computational costs performed in a neural network are reduced.

In an embodiment, the computing device 130 includes and associates all the description provided herein with a Graphics Processing Unit (GPU). In an embodiment, the computing device 130 is configured to receive or obtain input data 120 and generate a difference value, or at least an indicator 140 that includes information of a mathematical relationship between block-exponent values of a data set representing the input data 120. The input data 120 may be received by the computing device 130 from another computing device, computing service, virtual machine, virtual service (not depicted in FIG. 1) outside or inside of the computing environment either over a network 180 that is either a wireless network or a wired network.

In an embodiment, the computing device 130 comprises a front-end service 102. The front-end service 102 may be a computer system or component thereof configured to receive or obtain input data 120. The front-end service 102 may be an Analog-to-Digital (ADC) converter, for example. The ADC, in an embodiment, is a computing system that is capable of receiving or obtaining analog signals as input and converting those signals into digital signals. Analog signals may be signals picked up by a microphone or light entering a digital camera that are provided to the computing device 130. The ADC, in an embodiment, is then configured to covert analog signals into digital signals, which then are then real numbers represented in bits to form a data set or a matrix (consisting of rows and columns). The ADC, as described herein with respect to FIG. 1 is an illustrative embodiment of a front-end receiving service/computing device that could be implemented in a computing device 130 that takes, receives, or obtains input data 120. In another embodiment, input data 120 are already digital signals and the signals have been converted to values in a matrix before reaching a front-end service 102, such as an ADC. Hence, the ADC may possibly be bypassed or subtracted from the computing device 130. In an embodiment, instead of the ADC receiving signals, the front-end service 102 is a computing service/device such as a server computer system, a server cluster, a virtual computer system, a virtual server, a virtual runtime environment, a container environment, a server less execution environment, service hosting system, or any suitable computing entity that is used and associated with computing device 130 to receive input data 120.

In an embodiment, once the signals have been converted to digital signals or have been verified as digital signals, the digital signals are represented as values in a data set. In an embodiment, the values are stored as input data 120 in a matrix. In an embodiment, the computing device 130 comprises the BFP encoder 104. In an embodiment, the BFP encoder 104 is referred to as a BFP generator. The BFP encoder 104 may be configured to receive or obtain the input data 120 set of values from the front-end service 102. That is, the input data 120 may be represented using floating point representation to represent real numbers. Thus, a block floating point or a BFP encoder 104, as described herein, is used to provide an arithmetic algorithm which assigns each block of data from the input data 120 set an exponent. This way, each individual exponent for each element in the block does not have to be stored.

Thus, in an embodiment, the BFP encoder 104 performs a first step of operations to the input data 120 set to identify a common (or maximum) exponent value amongst all the values in a block of the input data 120 set. Specifically, in an embodiment, if the block of the input data 120 set are numbers in the format of $(sign)a*2^n$ (e.g., a times 2 to the n which may be represented by storing bits representing a sign, a, and n), and each element has "n" of at least "100," "100" may be identified as common. This is performed because it would take less space to store $2^{(n-100)}$ for each element. Previous examples of solutions attempting to generate common or maximum exponent values for a data set, for instance, are e.g. bfloat16 (a.k.a. e8m7), and various forms of block-exponent representations.

As in another embodiment, if the entries in the block of the input data 120 set are $a*2^{70}$, $b*2^{59}$, $c*2^{65}$, and $d*2^{73}$, then the common element would be 73 (because all entries have an exponent of at most 73). This would result in using less storage space associated with the entries by storing 73, $a*2^{-3}$, $b*2^{-14}$, $c*2^{-8}$, and $d*2^{0}$ because storing the common exponent 73 and right-shifting each of the mantissas according to each exponent difference takes less space than storing the exponent of each element separately.

In yet another embodiment, if the entries in the block of the input data 120 set were $a*2^{70}$, $a*2^{59}$, $a*2^{65}$, and $a*2^{73}$, the common value could be "a" because each element has "a" in it, the common value could be $a*2^{59}$ because $a*2^{59}$ can be factored out of each element, the common value could be a vector (a, 59) because each element has a factor of a and an exponent of at least 59. In essence, by factoring out the common value amongst the entries of a data set, less storage space may be required.

Moreover, in an embodiment, the BFP encoder 104 further performs a second step of operations to identify a second common exponent value amongst a subset 150 of the values of the block of the input data 120 set. That is, in an embodiment, in a subsequent step following the identification of a common exponent value from the values of the data set as described above, the BFP encoder 104 performs the same operation again as done in the first step for individual subsets of the block. That is, following the example above, the BFP encoder 104 may identify "95" as common to each element for the subset 150 of the block (because each number in the subset is of the form $a*2^n$ with n at most "95").

As a result of identifying two common exponent values (one from the block of the input data 120 set and another from the subset 150 of the block of the input data set 120), a difference value may be determined or calculated. The difference value may be stored as an indicator 140, where the indicator 140 would provide a system with information of how to obtain the common exponent value of the subset 150 of the data set from the common exponent value of the block of the input data 120 set. As such, this difference value may simply be stored as "5" (because it indicates that the system would need to subtract "5" from "100," the common exponent value of the entire block identified in the first step). Thus, greater compression may be achieved when the instructions or information are provided to the BFP encoder 104 to cause the indicator 140 to be determined and eventually stored with the value "5" because, for the subset 150, storing "5" only once takes up less space than storing "95."

In an embodiment, the compressor 108 provides information or instructions to the BFP encoder 104 as to how to perform the first step of compressing blocks of the input data 120 set and further how to perform the second step of compressing individual subsets of the blocks of the input data set 120. The compressor may provide instructions to cause the BFP encoder 104 to select a first amount of elements in the input data 120 set as the block to be first compressed and further another amount of elements (that is smaller than the block to compress again. The compressor 108 may identify and provide instructions to the BFP encoder 104, based at least in part on user input and/or system policies, to determine the how a data set and its subsets are compressed to eventually determine a difference value. In an embodiment, the compressor 108 is not be a separate device or service from the BFP encoder 104 as illustrated in FIG. 1, but rather incorporated with the BFP encoder 104 to perform the operations described above.

Specifically, as an example embodiment, the BFP encoder 104 determines that a block from the input data 120 set (e.g., matrix) may be of size with 4×4 scalars. Once the block is compressed, a first common or maximum exponent may be determined. Subsequently, instructions from the compressor 108 to the BFP encoder 104 may indicate that a subset of the block be compressed. In an embodiment, the subset or quad of the block is of size with 2×2 scalars. Once the quad is compressed, a second common or maximum exponent value is determined. A difference value between the first common exponent value and the second common exponent value is calculated and further stored. In other words, the difference value may in itself be the indicator that is stored that allows a system to determine the second common exponent value and the values in the subset of the block based on the first common exponent value. However, in an embodiment, this difference value is not be stored but an indication of some sort for the difference value is stored. That is, after the difference value is determined, a system may simply store an indicator of the mathematical relationship between the first and second common exponent values and the values of the subset without having to store the second common exponent value itself. Specifically, in an embodiment, the indicator is a function that can be used to derive the first and second common exponent values.

In an embodiment, the computing device 130 includes a data store 106. The data store 106 is configured as a storage device that receives and stores the common exponent values of a data set. Specifically, in an embodiment, the data store 106 is configured to store the difference value, an indicator 140 corresponding to a mathematical relationship between the first and second common values and each value within one or more subsets of values, and/or an indication of how to determine a mathematical relationship between the first and second common exponent values and each value within the one or more subsets of values.) The storage requirements for storing the difference value, indicator, and/or indication of a mathematical relationship between the first and second common exponent values would be less than the storage requirement for storing each exponent value of an entry or element of matrix individually.

In an embodiment, the computing device 130 includes a decompressor 110. The decompressor 110 may be configured to receive compressed floating-point numbers with common exponent values and decomposes each floating-point number into an array of bytes, forming a matrix of bytes. The compressed floating point numbers may be received by the decompressor 110 from the BFP encoder 104 and/or it may come from data store 106. Then, in an embodiment, the decompressor 110 transposes the matrix resulting in a new matrix where the first rows show low entropy (exponent) and the last rows have high entropy (last mantissa bits). In other words, the decompressor 110 receives compressed data sets along with the stored difference values and/or indicators and is configured to decompress the data sets to generate data output. That is, the decompressor 110 may be configured to receive a set of instructions and/or algorithms that, when executed, causes the decompressor 110 to expand a compressed data set back to its original form (e.g., to regenerate values in matrix 120 before the values were compressed either, for example, via a lossy or lossless compression technique). In an embodiment, the decompressor 110 decompresses a compressed data set after additional mathematical operations have been performed on the compressed data set and thus generates data output that is different from the original values in the matrix 120.

Figure 2:
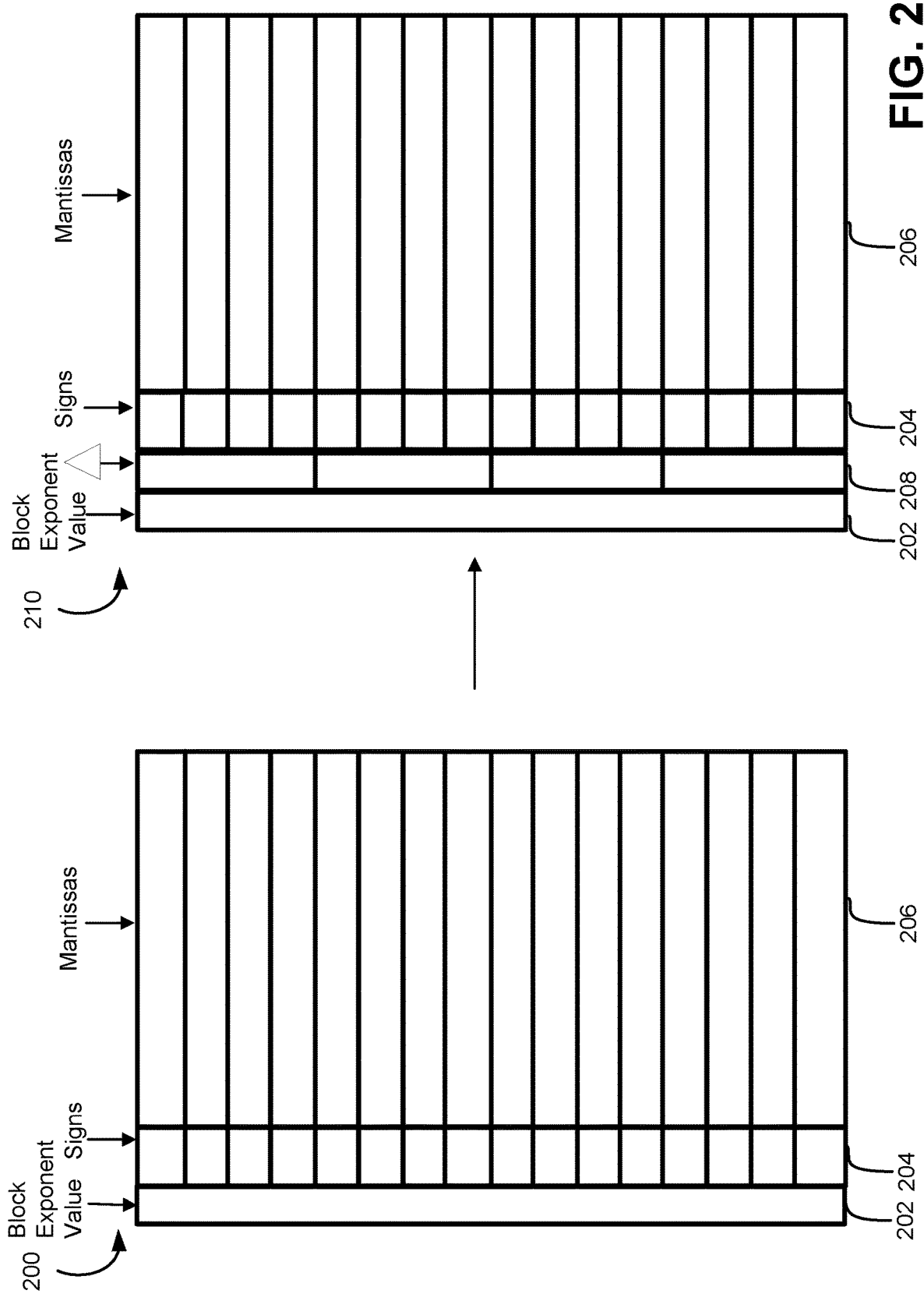
FIG. 2 illustrates a diagram of a matrix that includes a set of values represented by an exponent, signs, and mantissas (e.g., according to block floating point formats) and another diagram of a matrix that includes a set of values represented by an exponent, compressed numerical representations, signs, and mantissas (according to block floating point format with compressed numerical representations), in accordance with an embodiment.

FIG. 2 illustrates a diagram 200 of a matrix that, when filled, includes a set of values represented by a common exponent 202, signs 204, and mantissas 206, in accordance with an embodiment. In an embodiment, diagram 200 is a representation of a matrix with a data set that is represented using floating point representation to represent real numbers. In an embodiment, floating point numbers are represented in bits where a subsequence of the bits represents an exponent for the number "2," for example. Specifically, numbers can be represented as (sign)*a*2^n and their floating point representation has bits for the sign, n, and a. In an embodiment, one value in the diagram 200 is represented by a sequence of bits where it's common exponent 202 is "10000011," sign 204 is "0," and the mantissa 206 is "01100000000000000000000." The result of this value would be the number 1.0011×2^4=22 in decimal.

In an embodiment, if every element in a 4×4 sized block of the matrix has an exponent of at most "k," a system performs the first operation as described above with respect to FIG. 1 and store "k" once, which would be stored as the common exponent 202. Moreover, in an embodiment, the system stores every value of the matrix with an exponent of "k−n," which takes fewer bits to store than with an exponent of "n."

Moreover, FIG. 2 illustrates another diagram 210 of a matrix that includes a set of values represented by an exponent 202, compressed numerical representation 208, signs 204, and mantissas 206 (or block floating point with compressed numerical representations), in accordance with an embodiment. In an embodiment, the second diagram 210 of FIG. 2 is subdivided into 2×2 submatrices and after performing the same process as indicated above, a second common exponent is determined for the subdivided set. The size of the subdivided set may be predetermined, arbitrary, random, and/or determined by user input. In an embodiment, this second common exponent for each 2×2 submatrix (or sub-block) is not stored. Instead, a compressed numerical representation 208 is calculated for each of these 2×2 submatrices. The compressed numerical representation 208 may be calculated by subtracting the second common exponent from the common exponent 202 and stored as a difference value (or delta value). The size of the compressed numerical representation 208 may be a predetermined amount of bits represented with a number bits Q, which and less than the size of the second common exponents calculated for each 2×2 submatrix (or sub-block). In other words, the size of the predetermined amount of bits would be no greater than the bits of the second common exponent.

In other words, from each of these 2×2 submatrices, the same process of extracting the common exponent value 202 from a block is performed, but instead of storing the exponent that can be pulled out, a compressed numerical representation 208 is stored between the exponent that has been extracted and the first common exponent value from the first step of operations. In an embodiment, this compressed numerical representation 208 is not an integer that's representative for each of the 2×2 submatrices, but instead is some sort of indicator to determine the compressed numerical representation 208. The compressed numerical representation 208 is typically small and, therefore, takes fewer bits to store. In an embodiment, the compressed numerical representation 208 is just an indicator that is a function that is stored such that the second common exponent values can be derived.

Figure 3:
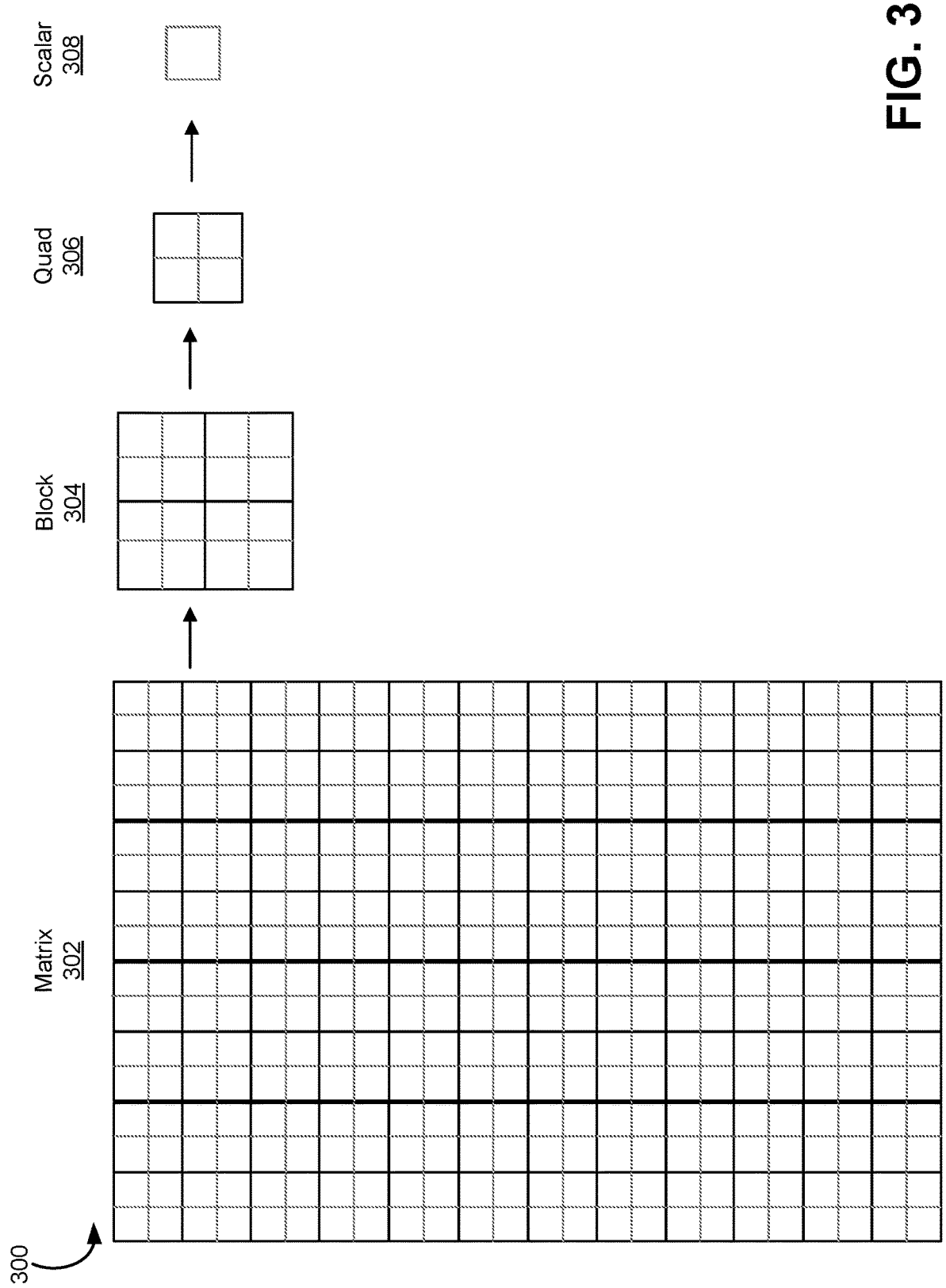
FIG. 3 illustrates a diagram of an example matrix, submatrix (or block), submatrix of the block (or quad), and a scalar, in accordance with an embodiment.

FIG. 3 illustrates a diagram of an example matrix 302 (similar to the input data 120 set of FIG. 1), submatrix (or block) 304, submatrix of the block (or quad) 306, and scalar 308, in accordance with an embodiment. In an embodiment, a data set is represented using floating point representation to represent real numbers as elements of a matrix 302. That is, matrix 302, in an embodiment, has 24 rows and 16 columns. In an embodiment, the matrix 302 is configured with different amounts of rows and columns.

In an embodiment, a submatrix (or block) 304 is a subdivision of the matrix 302 into blocks of 16 elements (e.g., 4×4 scalars). The block size may be determined randomly or predetermined by user input. Moreover, the block size may further be determined based at least in part on user input or metadata associated with the matrix.

In an embodiment, a quad 306 of size 2×2 scalars is a subdivision of the submatrix (or block) 304. The quad size may be determined randomly or predetermined by user input. Moreover, the quad size may further be determined based at least in part on user input or metadata associated with the matrix.

In an embodiment, a scalar 308 is a subdivision, a single element, or an individual element of a matrix 302. Each scalar 308 may be a floating point number that is represented in bits.

Figure 4:
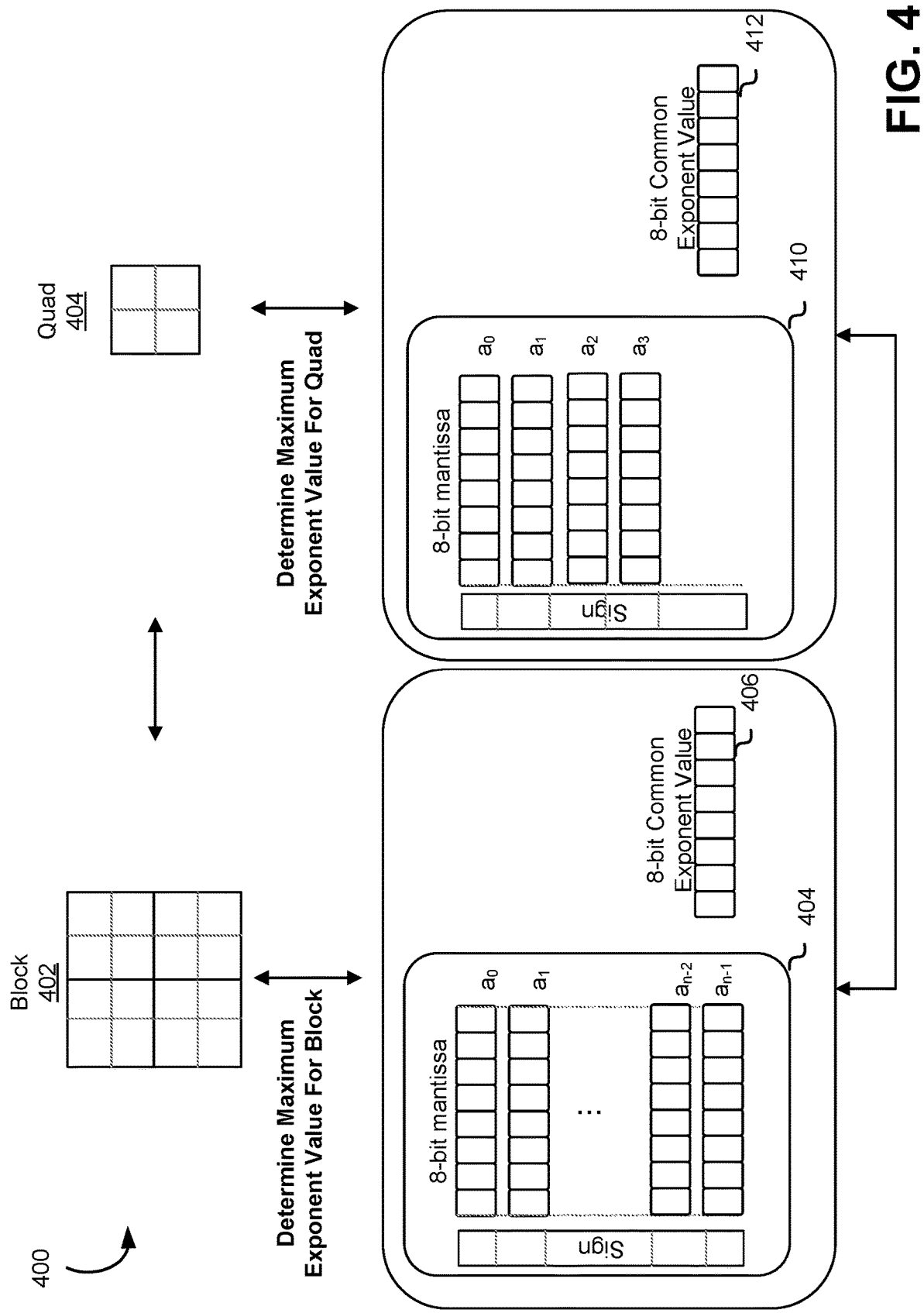
FIG. 4 illustrates a diagram in which common exponent values are determined for a block and a quad, in accordance with an embodiment.

FIG. 4 illustrates a diagram 400 in which common exponent values are determined for submatrices of a matrix, in accordance with an embodiment. In an embodiment, submatrix (or block) 402 is a data set of values that is of size 4×4 scalars extracted from matrix 302 of FIG. 3.

In an embodiment, block 402 and the size of block 402 is determined by the BFP encoder as described with respect to FIG. 1 above. In an embodiment, the block 402 and its size is determined by user input and/or system policies. A first common or maximum exponent value 406 can be determined amongst all the values in the block 402. In an embodiment, the first common or maximum exponent value 406 has the size of 10 bits. The first common exponent value 406 may represent the sign and mantissas 404 that share at least this first common or maximum exponent value. This way the common exponent value 406 is stored for the block 402 just once instead of having to store each of the exponent values of each element in the block 402 individually. That is, instead of storing 16 exponent values for 16 scalars in the block 402, for example, only a single shared exponent value among for all of the elements in the block 402 is stored.

In an embodiment, a quad 408 is determined by subdividing the block 402 into a 2×2 scalars. As noted above, the quad 408 is a subset of the block 402 and the quad's size may be predetermined or selected such that there is a high probability that the common exponent value 412 of the quad 408 is at least the same or smaller than the common exponent value 412 of the block 402. Once the quad 408 is determined, the subsequent step would be to perform the same compression operation (as that was performed to the block 402) to determine the common exponent value 412 for the quad 408. This common exponent value 412 for the quad 408 would be an exponent value for the sign and mantissa's 410 of the quad 408.

As described above, the difference between the common exponent value 406 for the block 402 and the common exponent value 412 of the quad 408 is determined. This difference value is then used as an indicator of the relationship or mathematical relationship between the two common exponent values 406, 412. The difference value is typically small (smaller than the size of the common exponent value 406 for the block 402 and/or the size of the common exponents value 412 of the quad 408) and may be assigned to be presented as a "q-bits" integer. The size or number for "q-bits" may be predetermined by user input and/or system policies. In an embodiment, this iteration of determining the difference value is performed continuously until all difference values for the matrix and submatrices are determined. The amount of iterations may be dependent on how large the matrix is to begin with.

Figure 5:
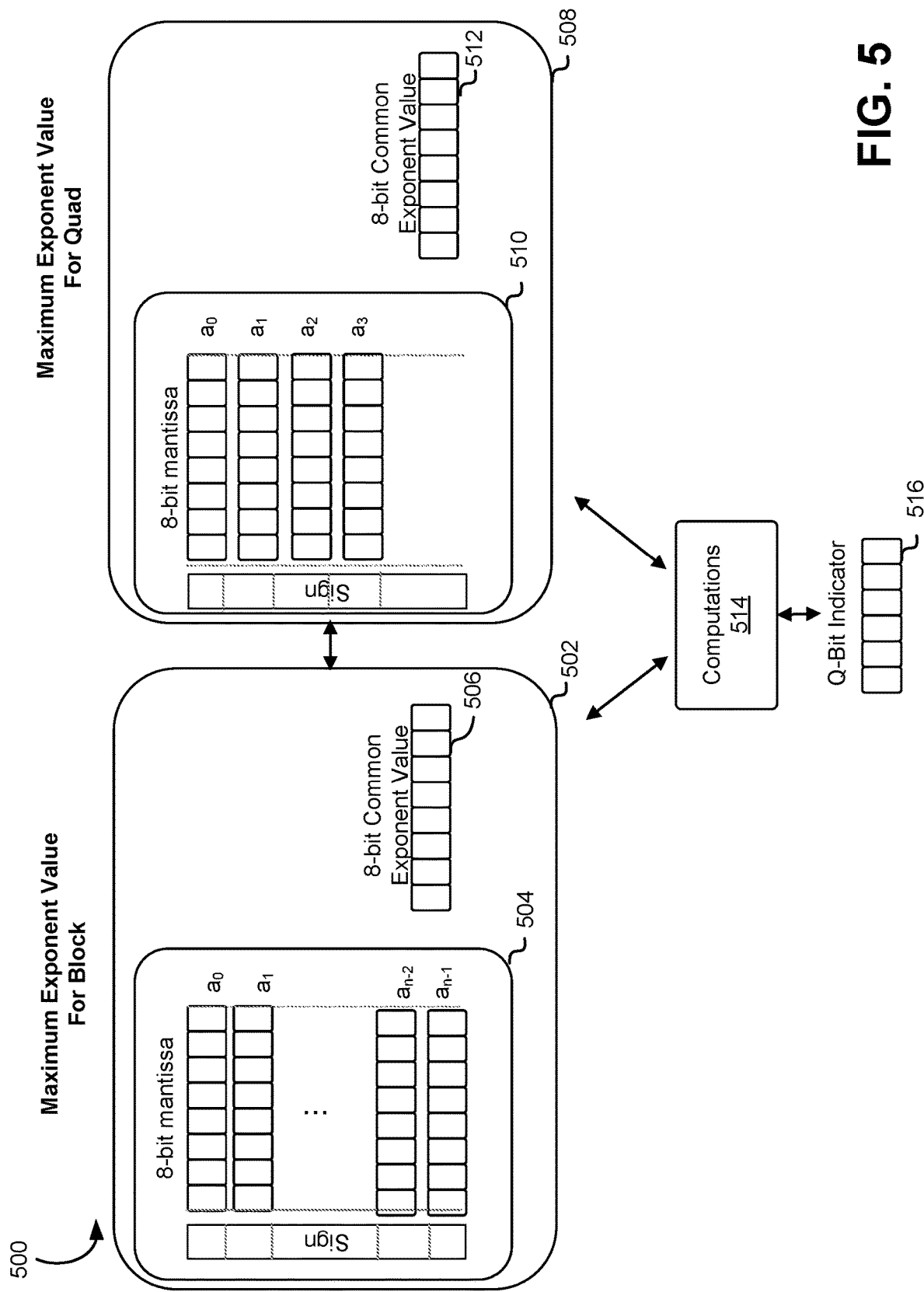
FIG. 5 illustrates a diagram in which a compressed numerical representation (or indicator) that corresponds to a mathematical relationship between values in a block and a quad is determined, in accordance with an embodiment.

FIG. 5 illustrates a diagram 500 in which a difference value (or indicator 516) is determined that corresponds to mathematical relationship between the common values 506, 512 in a block and a quad, in accordance with an embodiment. That is, following the description with respect to FIG. 4, after a block (submatrix of a matrix) 502 extracts or determines a common exponent value 506 (e.g., first common value) for its sign and mantissas 504, the common exponent value 506 may be stored in a data store (not depicted in FIG. 5 but as described in FIG. 1). Subsequently, a submatrix of the block (e.g., quad) 508 may be determined such that another common exponent value 512 (e.g., second common value) is determined for the sign and mantissas 510 of the quad 508. This other common exponent value 512, in an embodiment, is not stored in the data store. Instead, a difference value (e.g., third value) between the common exponent value 506 and the other common exponent value 512 is determined and stored in the data store. The difference value may be an integer that is typically smaller in size to store than the other common exponent value 512. In an embodiment, the difference value (or indicator 516) is 6-bits in size. The size of the difference value (or indicator 516) may vary as 6-bits in size described herein is just one example and other possible sizes to store the difference value (or indicator 516) is possible. In an embodiment, the difference value is not an integer but rather an indication of how to determine the difference value. Thus, the difference value (or indicator 516) is simply a proxy for a system to determine, when necessary, the other common exponent value 512 by using computational methods 514 or mathematical computations based at least in part on the previously generated common exponent value 506.

Figure 6:
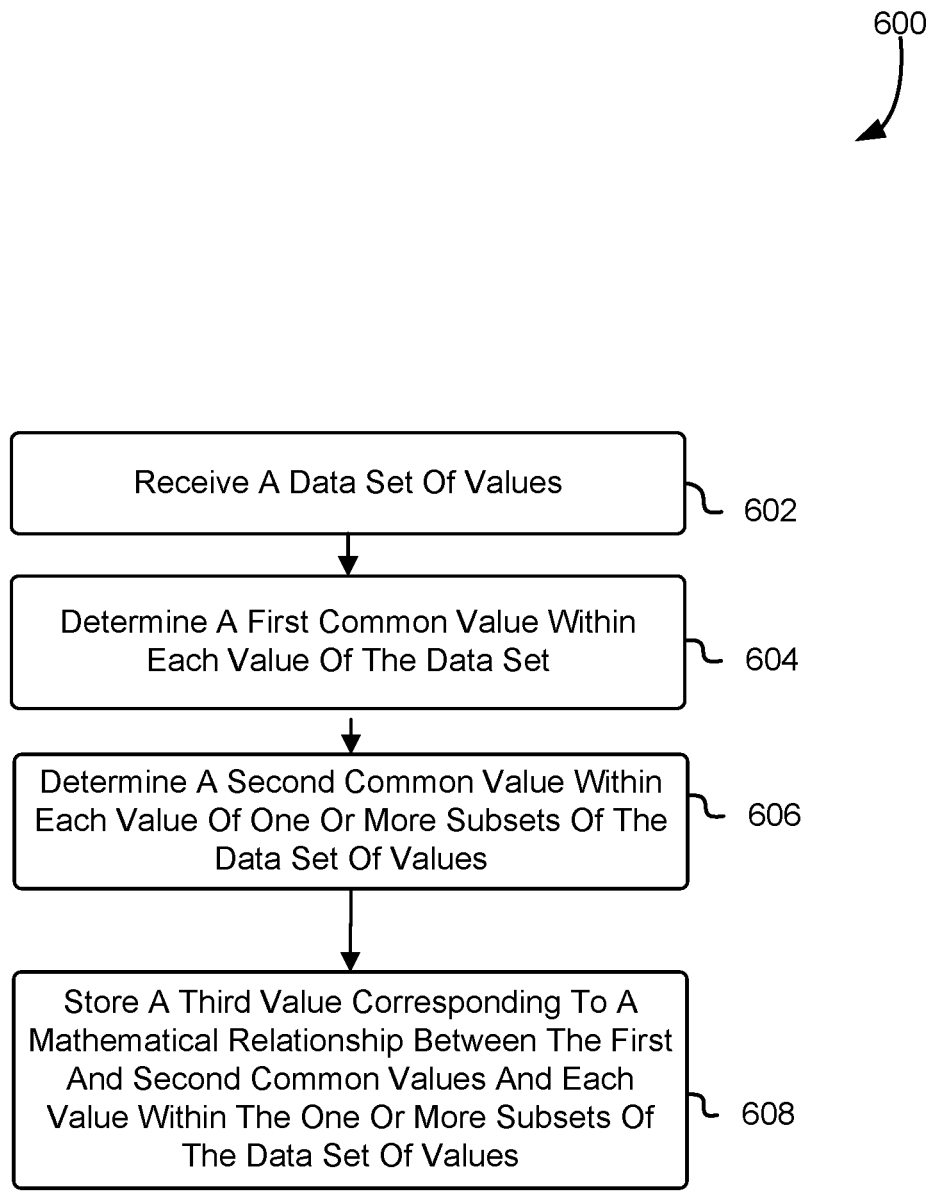
FIG. 6 shows an illustrative example of a process for generating a compressed numerical representation (or indicator) that corresponds to a mathematical relationship between exponent values in a data set, in accordance with an embodiment.

FIG. 6 shows an illustrative example of a process 600 for generating difference values (or indicators), in accordance with an embodiment. In an embodiment, a system with at least one or more processors (or one or more arithmetic logic unit (ALU) processors) is configured to include logic that receives or obtains a data set consisting of values 602. Moreover, the one or more processors further includes logic that determines a first common value (e.g., a first common exponent value or a first maximum exponent value) within each value of a first set of values 604. In an embodiment, the one or more processors are further configured to include logic that determines a second common value (e.g., a second common exponent value or a second maximum exponent value) within each value of one or more subsets of values of the first set of values 606. Moreover, the one or more processors are further configured to include logic that stores a third value corresponding to a mathematical relationship between the first and second common values and each value within the one or more subsets of values, wherein the third value requires less storage than the first and second common values 608. In an embodiment, the third value is an integer of a predetermined size. In an embodiment, the third value is simply an indicator or a function that can be used to derive both the first common and second common values.

Figure 7:
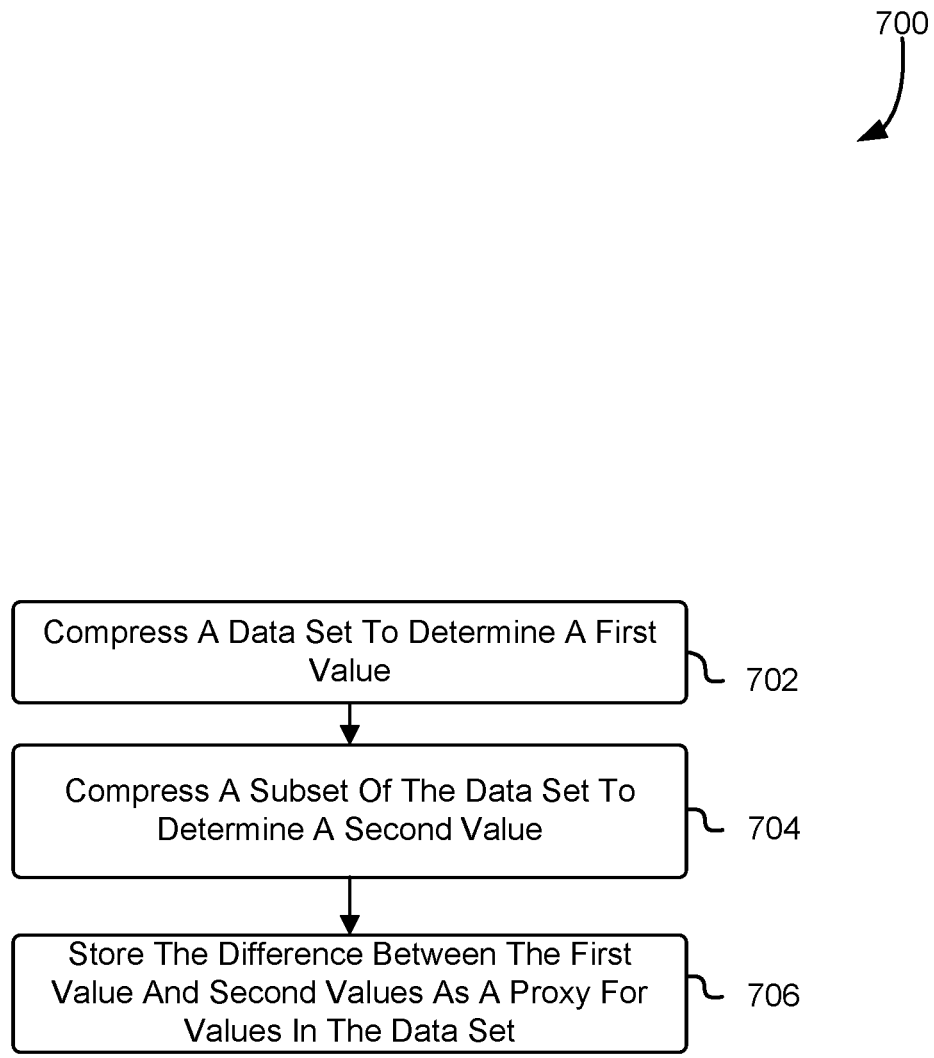
FIG. 7 shows another illustrative example of a process for generating a compressed numerical representation (or indicator) that corresponds to a mathematical relationship between exponent values in a data set, in accordance with an embodiment.

FIG. 7 shows another illustrative example of a process for generating difference values or indicators, in accordance with an embodiment. In an embodiment, a system with at least one or more processors is configured to include logic that receives or obtains a data set. The data set may be compressed to determine a first value common to all the values to the data set 702. Moreover, the processor may further include logic that compresses a subset of the data set to determine a second value that is common to the values of the subset 704. Once the first and second values are determined, a difference between the two values may be determined and stored 706. The difference value may be an indicator of the mathematical relationship between the first and second values and each of the values of the subset. In other words, the difference value may be a proxy (e.g., substitute for the second value) that provides information for a system to determine the second value and the values of the subset when used in connection with the first value. This difference value would require less storage space than storing the first and/or second values.

Figure 8:
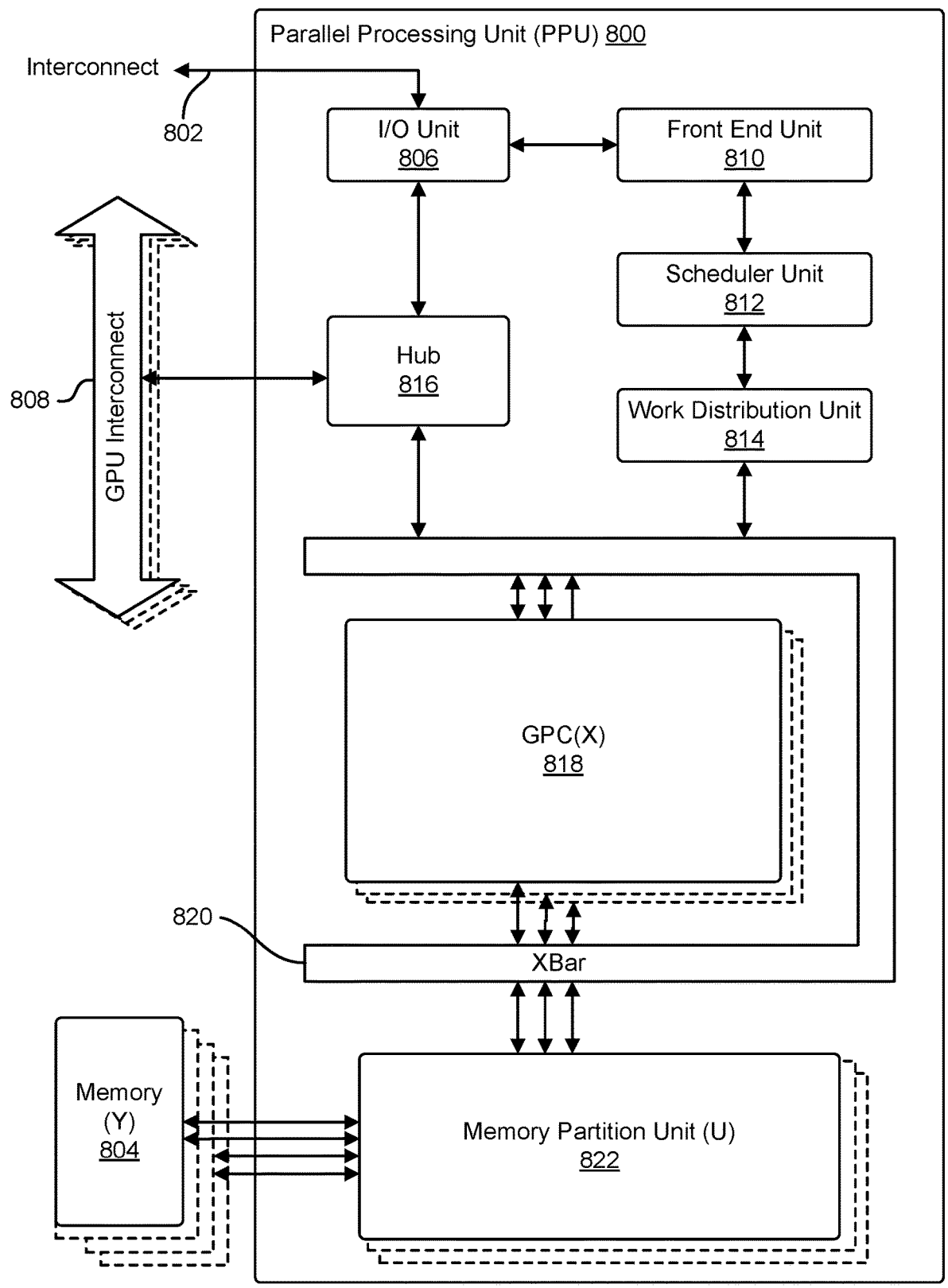
FIG. 8 illustrates an example of parallel processing unit ("PPU"), in accordance with an embodiment.

FIG. 8 illustrates a parallel processing unit ("PPU") 800, in accordance with one embodiment. In an embodiment, the PPU 800 is configured with machine-readable code that, if executed by the PPU, causes the PPU to perform some or all of processes and techniques described throughout this disclosure. In an embodiment, the PPU 800 is a multi-threaded processor that comprises one or more arithmetic logic units (ALUs) that is implemented on one or more integrated circuit devices and that utilizes multithreading as a latency-hiding technique designed to process computer-readable instructions (also referred to as machine-readable instructions or simply instructions) on multiple threads in parallel. In an embodiment, a thread refers to a thread of execution and is an instantiation of a set of instructions configured to be executed by the PPU 800. In an embodiment, the PPU 800 is a graphics processing unit ("GPU") configured to implement a graphics rendering pipeline for processing three-dimensional ("3D") graphics data in order to generate two-dimensional ("2D") image data for display on a display device such as a liquid crystal display (LCD) device. In an embodiment, the PPU 800 is utilized to perform computations such as linear algebra operations and machine-learning operations. FIG. 8 illustrates an example parallel processor for illustrative purposes only and should be construed as a non-limiting example of processor architectures contemplated within the scope of this disclosure and that any suitable processor may be employed to supplement and/or substitute for the same.

In an embodiment, one or more PPUs are configured to accelerate High Performance Computing ("HPC"), data center, and machine learning applications. In an embodiment, the PPU 800 is configured to accelerate deep learning systems and applications including the following non-limiting examples: autonomous vehicle platforms, deep learning, high-accuracy speech, image, text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and more.

In an embodiment, the PPU 800 includes an Input/Output ("I/O") unit 805, a front-end unit 810, a scheduler unit 812, a work distribution unit 814, a hub 816, a crossbar ("Xbar") 820, one or more general processing clusters ("GPCs") 818, and one or more partition units 822. In an embodiment, the PPU 800 is connected to a host processor or other PPUs 800 via one or more high-speed GPU interconnects 808. In an embodiment, the PPU 800 is connected to a host processor or other peripheral devices via an interconnect 802. In an embodiment, the PPU 800 is connected to a local memory comprising one or more memory devices 804. In an embodiment, the local memory comprises one or more dynamic random access memory ("DRAM") devices. In an embodiment, the one or more DRAM devices are configured and/or configurable as high-bandwidth memory ("HBM") subsystems, with multiple DRAM dies stacked within each device.

The high-speed GPU interconnect 808 may refer to a wire-based multi-lane communications link that is used by systems to scale and include one or more PPUs 800 combined with one or more CPUs, supports cache coherence between the PPUs 800 and CPUs, and CPU mastering. In an embodiment, data and/or commands are transmitted by the high-speed GPU interconnect 808 through the hub 816 to/from other units of the PPU 800 such as one or more copy engines, video encoders, video decoders, power management units, and other components which may not be explicitly illustrated in FIG. 8.

In an embodiment, the I/O unit 805 is configured to transmit and receive communications (e.g., commands, data) from a host processor (not illustrated in FIG. 8) over the system bus 802. In an embodiment, the I/O unit 805 communicates with the host processor directly via the system bus 802 or through one or more intermediate devices such as a memory bridge. In an embodiment, the I/O unit 805 may communicate with one or more other processors, such as one or more of the PPUs 800 via the system bus 802. In an embodiment, the I/O unit 805 implements a Peripheral Component Interconnect Express ("PCIe") interface for communications over a PCIe bus. In an embodiment, the I/O unit 805 implements interfaces for communicating with external devices.

In an embodiment, the I/O unit 805 decodes packets received via the system bus 802. In an embodiment, at least some packets represent commands configured to cause the PPU 800 to perform various operations. In an embodiment, the I/O unit 805 transmits the decoded commands to various other units of the PPU 800 as specified by the commands. In an embodiment, commands are transmitted to the front-end unit 810 and/or transmitted to the hub 816 or other units of the PPU 800 such as one or more copy engines, a video encoder, a video decoder, a power management unit, etc. (not explicitly illustrated in FIG. 8). In an embodiment, the I/O unit 805 is configured to route communications between and among the various logical units of the PPU 800.

In an embodiment, a program executed by the host processor encodes a command stream in a buffer that provides workloads to the PPU 800 for processing. In an embodiment, a workload comprises instructions and data to be processed by those instructions. In an embodiment, the buffer is a region in a memory that is accessible (e.g., read/write) by both the host processor and the PPU 800—the host interface unit may be configured to access the buffer in a system memory connected to the system bus 802 via memory requests transmitted over the system bus 802 by the I/O unit 805. In an embodiment, the host processor writes the command stream to the buffer and then transmits a pointer to the start of the command stream to the PPU 800 such that the front-end unit 810 receives pointers to one or more command streams and manages the one or more streams, reading commands from the streams and forwarding commands to the various units of the PPU 800.

In an embodiment, the front-end unit 810 is coupled to a scheduler unit 812 that configures the various GPCs 818 to process tasks defined by the one or more streams. In an embodiment, the scheduler unit 812 is configured to track state information related to the various tasks managed by the scheduler unit 812 where the state information may indicate which GPC 818 a task is assigned to, whether the task is active or inactive, a priority level associated with the task, and so forth. In an embodiment, the scheduler unit 812 manages the execution of a plurality of tasks on the one or more GPCs 818.

In an embodiment, the scheduler unit 812 is coupled to a work distribution unit 814 that is configured to dispatch tasks for execution on the GPCs 818. In an embodiment, the work distribution unit 814 tracks a number of scheduled tasks received from the scheduler unit 812 and the work distribution unit 814 manages a pending task pool and an active task pool for each of the GPCs 818. In an embodiment, the pending task pool comprises a number of slots (e.g., 32 slots) that contain tasks assigned to be processed by a particular GPC 818; the active task pool may comprise a number of slots (e.g., 4 slots) for tasks that are actively being processed by the GPCs 818 such that as a GPC 818 completes the execution of a task, that task is evicted from the active task pool for the GPC 818 and one of the other tasks from the pending task pool is selected and scheduled for execution on the GPC 818. In an embodiment, if an active task is idle on the GPC 818, such as while waiting for a data dependency to be resolved, then the active task is evicted from the GPC 818 and returned to the pending task pool while another task in the pending task pool is selected and scheduled for execution on the GPC 818.

In an embodiment, the work distribution unit 814 communicates with the one or more GPCs 818 via XBar 820. In an embodiment, the XBar 820 is an interconnect network that couples many of the units of the PPU 800 to other units of the PPU 800 and can be configured to couple the work distribution unit 814 to a particular GPC 818. Although not shown explicitly, one or more other units of the PPU 800 may also be connected to the XBar 820 via the hub 816.

The tasks are managed by the scheduler unit 812 and dispatched to a GPC 818 by the work distribution unit 814. The GPC 818 is configured to process the task and generate results. The results may be consumed by other tasks within the GPC 818, routed to a different GPC 818 via the XBar 820, or stored in the memory 804. The results can be written to the memory 804 via the partition units 822, which implement a memory interface for reading and writing data to/from the memory 804. The results can be transmitted to another PPU 804 or CPU via the high-speed GPU interconnect 808. In an embodiment, the PPU 800 includes a number U of partition units 822 that is equal to the number of separate and distinct memory devices 804 coupled to the PPU 800. A partition unit 822 will be described in more detail below in conjunction with FIG. 10.

In an embodiment, a host processor executes a driver kernel that implements an application programming interface ("API") that enables one or more applications executing on the host processor to schedule operations for execution on the PPU 800. In an embodiment, multiple compute applications are simultaneously executed by the PPU 800 and the PPU 800 provides isolation, quality of service ("QoS"), and independent address spaces for the multiple compute applications. In an embodiment, an application generates instructions (e.g., in the form of API calls) that cause the driver kernel to generate one or more tasks for execution by the PPU 800 and the driver kernel outputs tasks to one or more streams being processed by the PPU 800. In an embodiment, each task comprises one or more groups of related threads, which may be referred to as a warp. In an embodiment, a warp comprises a plurality of related threads (e.g., 32 threads) that can be executed in parallel. In an embodiment, cooperating threads can refer to a plurality of threads including instructions to perform the task and that exchange data through shared memory. Threads and cooperating threads are described in more detail, in accordance with one embodiment, in conjunction with FIG. 10.

Figure 9:
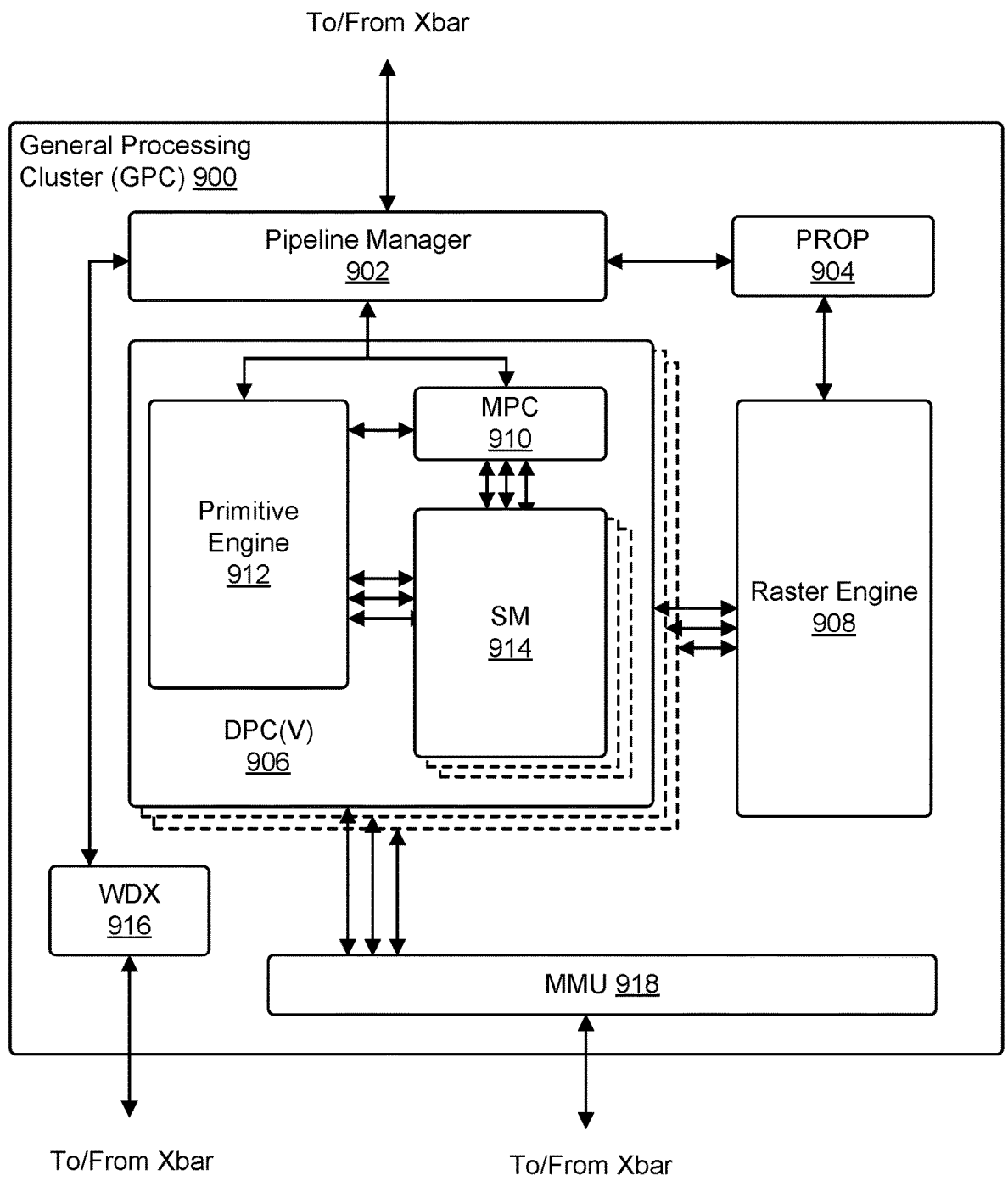
FIG. 9 illustrates an example of a general processing cluster ("GPC"), in accordance with an embodiment.

FIG. 9 illustrates a GPC 900 such as the GPC illustrated of the PPU 800 of FIG. 8, in accordance with one embodiment. In an embodiment, each GPC 900 includes a number of hardware units for processing tasks and each GPC 900 includes a pipeline manager 902, a pre-raster operations unit ("PROP") 904, a raster engine 908, a work distribution crossbar ("WDX") 916, a memory management unit ("MMU") 918, one or more Data Processing Clusters ("DPCs") 906, and any suitable combination of parts. It will be appreciated that the GPC 900 of FIG. 9 may include other hardware units in lieu of or in addition to the units shown in FIG. 9.

In an embodiment, the operation of the GPC 900 is controlled by the pipeline manager 902. The pipeline manager 902 manages the configuration of the one or more DPCs 906 for processing tasks allocated to the GPC 900. In an embodiment, the pipeline manager 902 configures at least one of the one or more DPCs 906 to implement at least a portion of a graphics rendering pipeline. In an embodiment, a DPC 906 is configured to execute a vertex shader program on the programmable streaming multiprocessor ("SM") 914. The pipeline manager 902 is configured to route packets received from a work distribution to the appropriate logical units within the GPC 900, in an embodiment, and some packets may be routed to fixed function hardware units in the PROP 904 and/or raster engine 908 while other packets may be routed to the DPCs 906 for processing by the primitive engine 912 or the SM 914. In an embodiment, the pipeline manager 902 configures at least one of the one or more DPCs 906 to implement a neural network model and/or a computing pipeline.

The PROP unit 904 is configured, in an embodiment, to route data generated by the raster engine 908 and the DPCs 906 to a Raster Operations ("ROP") unit in the memory partition unit, described in more detail above. In an embodiment, the PROP unit 904 is configured to perform optimizations for color blending, organize pixel data, perform address translations, and more. The raster engine 908 includes a number of fixed function hardware units configured to perform various raster operations, in an embodiment, and the raster engine 908 includes a setup engine, a coarse raster engine, a culling engine, a clipping engine, a fine raster engine, a tile coalescing engine, and any suitable combination thereof. The setup engine, in an embodiment, receives transformed vertices and generates plane equations associated with the geometric primitive defined by the vertices; the plane equations are transmitted to the coarse raster engine to generate coverage information (e.g., an x, y coverage mask for a tile) for the primitive; the output of the coarse raster engine is transmitted to the culling engine where fragments associated with the primitive that fail a z-test are culled, and transmitted to a clipping engine where fragments lying outside a viewing frustum are clipped. In an embodiment, the fragments that survive clipping and culling are passed to the fine raster engine to generate attributes for the pixel fragments based on the plane equations generated by the setup engine. In an embodiment, the output of the raster engine 908 comprises fragments to be processed by any suitable entity such as by a fragment shader implemented within a DPC 906.

In an embodiment, each DPC 906 included in the GPC 900 comprises an M-Pipe Controller ("MPC") 910; a primitive engine 912; one or more SMs 914; and any suitable combination thereof. In an embodiment, the MPC 910 controls the operation of the DPC 906, routing packets received from the pipeline manager 902 to the appropriate units in the DPC 906. In an embodiment, packets associated with a vertex are routed to the primitive engine 912, which is configured to fetch vertex attributes associated with the vertex from memory; in contrast, packets associated with a shader program may be transmitted to the SM 914.

In an embodiment, the SM 914 comprises a programmable streaming processor that is configured to process tasks represented by a number of threads. In an embodiment, the SM 914 is multi-threaded and configured to execute a plurality of threads (e.g., 32 threads) from a particular group of threads concurrently and implements a SIMD (Single-Instruction, Multiple-Data) architecture where each thread in a group of threads (e.g., a warp) is configured to process a different set of data based on the same set of instructions. In an embodiment, all threads in the group of threads execute the same instructions. In an embodiment, the SM 914 implements a SIMT (Single-Instruction, Multiple Thread) architecture wherein each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. In an embodiment, execution state is maintained for each individual thread and threads executing the same instructions may be converged and executed in parallel for better efficiency. In an embodiment, the SM 914 is described in more detail below.

In an embodiment, the MMU 918 provides an interface between the GPC 900 and the memory partition unit and the MMU 918 provides translation of virtual addresses into physical addresses, memory protection, and arbitration of memory requests. In an embodiment, the MMU 918 provides one or more translation lookaside buffers ("TLBs") for performing translation of virtual addresses into physical addresses in memory.

Figure 10:
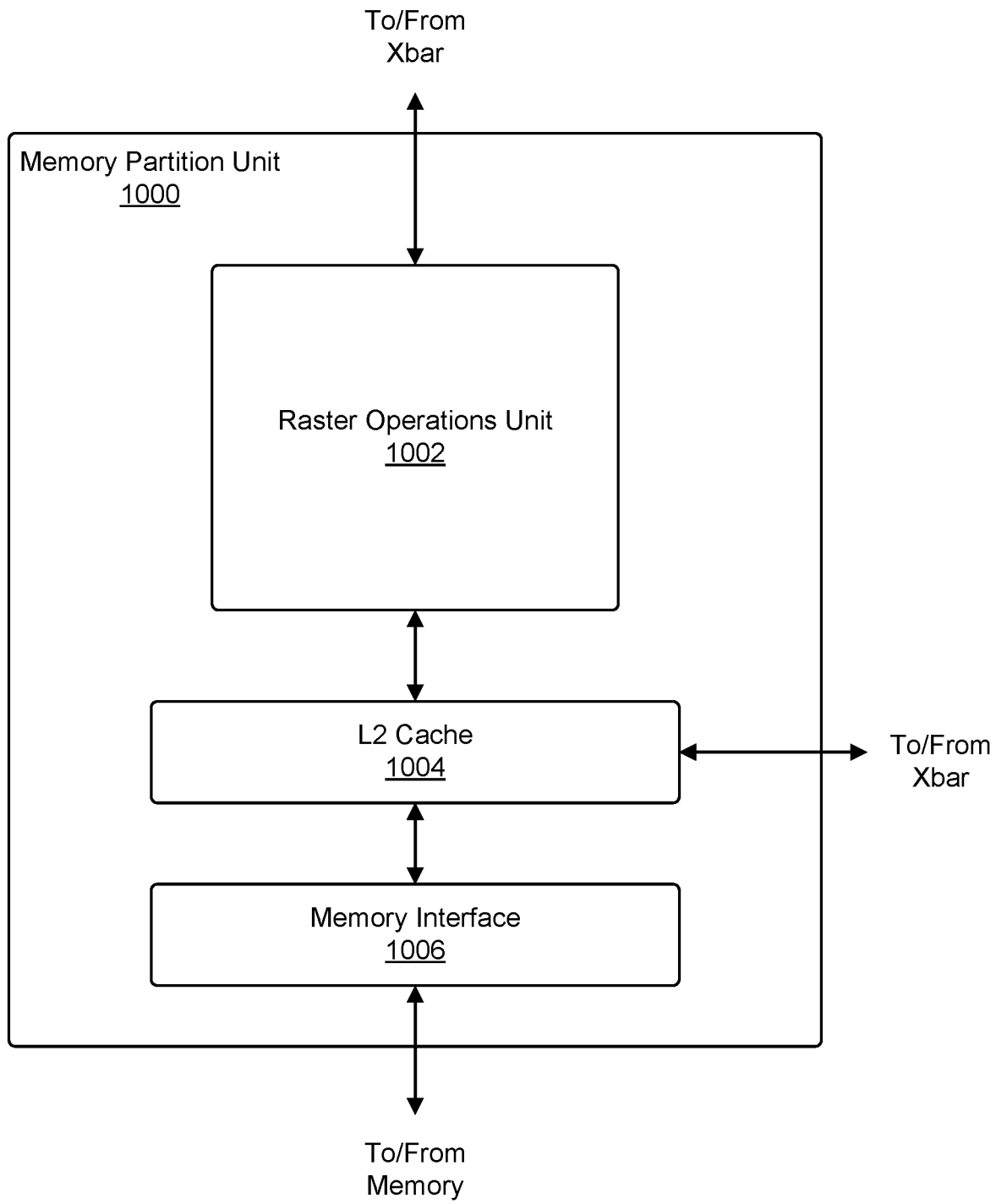
FIG. 10 illustrates an example of a memory partition unit, in accordance with an embodiment.

FIG. 10 illustrates a memory partition unit of a PPU, in accordance with one embodiment. In an embodiment, the memory partition unit 1000 includes a Raster Operations ("ROP") unit 1002; a level two ("L2") cache 1004; a memory interface 1006; and any suitable combination thereof. The memory interface 1006 is coupled to the memory. Memory interface 1006 may implement 32, 64, 128, 1024-bit data buses, or the like, for high-speed data transfer. In an embodiment, the PPU incorporates U memory interfaces 1006, one memory interface 1006 per pair of partition units 1000, where each pair of partition units 1000 is connected to a corresponding memory device. For example, PPU may be connected to up to Y memory devices, such as high bandwidth memory stacks or graphics double-data-rate, version 5, synchronous dynamic random access memory ("GDDR5 SDRAM").

In an embodiment, the memory interface 1006 implements an HBM2 memory interface and Y equals half U. In an embodiment, the HBM2 memory stacks are located on the same physical package as the PPU, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory supports Single-Error Correcting Double-Error Detecting ("SECDED") Error Correction Code ("ECC") to protect data. ECC provides higher reliability for compute applications that are sensitive to data corruption. Reliability is especially important in large-scale cluster computing environments where PPUs process very large datasets and/or run applications for extended periods.

In an embodiment, the PPU implements a multi-level memory hierarchy. In an embodiment, the memory partition unit 1000 supports a unified memory to provide a single unified virtual address space for CPU and PPU memory, enabling data sharing between virtual memory systems. In an embodiment the frequency of accesses by a PPU to memory located on other processors is trace to ensure that memory pages are moved to the physical memory of the PPU that is accessing the pages more frequently. In an embodiment, the high-speed GPU interconnect 808 supports address translation services allowing the PPU to directly access a CPU's page tables and providing full access to CPU memory by the PPU.

In an embodiment, copy engines transfer data between multiple PPUs or between PPUs and CPUs. In an embodiment, the copy engines can generate page faults for addresses that are not mapped into the page tables and the memory partition unit 1000 then services the page faults, mapping the addresses into the page table, after which the copy engine performs the transfer. In an embodiment, memory is pinned (i.e., non-pageable) for multiple copy engine operations between multiple processors, substantially reducing the available memory. In an embodiment, with hardware page faulting, addresses can be passed to the copy engines without regard as to whether the memory pages are resident, and the copy process is transparent.

Data from the memory of FIG. 8 or other system memory is fetched by the memory partition unit 1000 and stored in the L2 cache 1004, which is located on-chip and is shared between the various GPCs, in accordance with one embodiment. Each memory partition unit 1000, in an embodiment, includes at least a portion of the L2 cache 960 associated with a corresponding memory device. In an embodiment, lower level caches are implemented in various units within the GPCs. In an embodiment, each of the SMs 1040 may implement a level one ("L1") cache wherein the L1 cache is private memory that is dedicated to a particular SM 1040 and data from the L2 cache 1004 is fetched and stored in each of the L1 caches for processing in the functional units of the SMs 1040. In an embodiment, the L2 cache 1004 is coupled to the memory interface 1006 and the XBar 820.

The ROP unit 1002 performs graphics raster operations related to pixel color, such as color compression, pixel blending, and more, in an embodiment. The ROP unit $$50, in an embodiment, implements depth testing in conjunction with the raster engine 1025, receiving a depth for a sample location associated with a pixel fragment from the culling engine of the raster engine 1025. In an embodiment, the depth is tested against a corresponding depth in a depth buffer for a sample location associated with the fragment. In an embodiment, if the fragment passes the depth test for the sample location, then the ROP unit 1002 updates the depth buffer and transmits a result of the depth test to the raster engine 1025. It will be appreciated that the number of partition units 1000 may be different than the number of GPCs and, therefore, each ROP unit 1002 can, in an embodiment, be coupled to each of the GPCs. In an embodiment, the ROP unit 1002 tracks packets received from the different GPCs and determines which that a result generated by the ROP unit 1002 is routed to through the Xbar.

Figure 11:
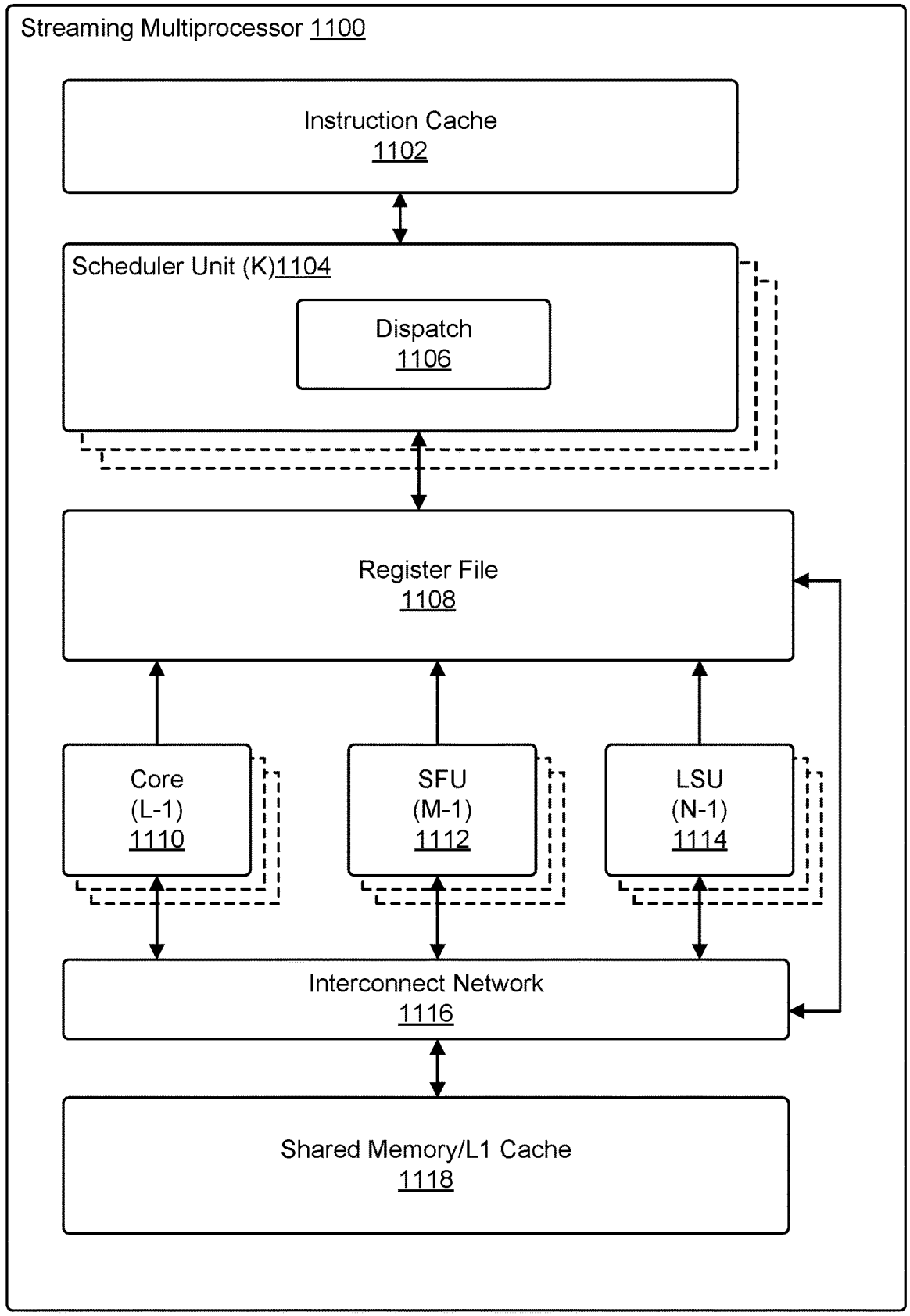
FIG. 11 illustrates an example of a streaming multiprocessor, in accordance with an embodiment.

FIG. 11 illustrates a streaming multi-processor such as the streaming multi-processor of FIG. 9, in accordance with one embodiment. In an embodiment, the SM 1100 includes: an instruction cache 1102; one or more scheduler units 1104; a register file 1108; one or more processing cores 1110; one or more special function units ("SFUs") 1112; one or more load/store units ("LSUs") 1114; an interconnect network 1116; a shared memory/L1 cache 1118; and any suitable combination thereof. In an embodiment, the work distribution unit dispatches tasks for execution on the GPCs of the PPU and each task is allocated to a particular DPC within a GPC and, if the task is associated with a shader program, the task is allocated to an SM 1100. In an embodiment, the scheduler unit 1104 receives the tasks from the work distribution unit and manages instruction scheduling for one or more thread blocks assigned to the SM 1100. In an embodiment, the scheduler unit 1104 schedules thread blocks for execution as warps of parallel threads, wherein each thread block is allocated at least one warp. In an embodiment, each warp executes threads. In an embodiment, the scheduler unit 1104 manages a plurality of different thread blocks, allocating the warps to the different thread blocks and then dispatching instructions from the plurality of different cooperative groups to the various functional units (e.g., cores 1110, SFUs 1112, and LSUs 1114) during each clock cycle.

Cooperative Groups may refer to a programming model for organizing groups of communicating threads that allows developers to express the granularity at which threads are communicating, enabling the expression of richer, more efficient parallel decompositions. In an embodiment, cooperative launch APIs support synchronization amongst thread blocks for the execution of parallel algorithms. In an embodiment, applications of conventional programming models provide a single, simple construct for synchronizing cooperating threads: a barrier across all threads of a thread block (e.g., the syncthreads( )) function). However, programmers would often like to define groups of threads at smaller than thread block granularities and synchronize within the defined groups to enable greater performance, design flexibility, and software reuse in the form of collective group-wide function interfaces. Cooperative Groups enables programmers to define groups of threads explicitly at sub-block (i.e., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

In an embodiment, a dispatch unit 1106 is configured to transmit instructions to one or more of the functional units and the scheduler unit 1104 includes two dispatch units 1106 that enable two different instructions from the same warp to be dispatched during each clock cycle. In an embodiment, each scheduler unit 1104 includes a single dispatch unit 1106 or additional dispatch units 1106.

Each SM 1100, in an embodiment, includes a register file 1108 that provides a set of registers for the functional units of the SM 1100. In an embodiment, the register file 1108 is divided between each of the functional units such that each functional unit is allocated a dedicated portion of the register file 1108. In an embodiment, the register file 1108 is divided between the different warps being executed by the SM 1100 and the register file 1108 provides temporary storage for operands connected to the data paths of the functional units. In an embodiment, each SM 1100 comprises a plurality of L processing cores 1110. In an embodiment, the SM 1100 includes a large number (e.g., 128 or more) of distinct processing cores 1110. Each core 1110, in an embodiment, includes a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the cores 1110 include 64 single-precision (32-bit) floating point cores, 64 integer cores, 32 double-precision (64-bit) floating point cores, and 8 tensor cores.

Tensor cores are configured to perform matrix operations in accordance with an embodiment. In an embodiment, one or more tensor cores are included in the cores 1110. In an embodiment, the tensor cores are configured to perform deep learning matrix arithmetic, such as convolution operations for neural network training and inferencing. In an embodiment, each tensor core operates on a 4×4 matrix and performs a matrix multiply and accumulate operation D=A× B+C, where A, B, C, and D are 4×4 matrices.

In an embodiment, the matrix multiply inputs A and B are 16-bit floating point matrices and the accumulation matrices C and D are 16-bit floating point or 32-bit floating point matrices. In an embodiment, the tensor cores operate on 16-bit floating point input data with 32-bit floating point accumulation. In an embodiment, the 16-bit floating point multiply requires 64 operations and results in a full precision product that is then accumulated using 32-bit floating point addition with the other intermediate products for a 4×4×4 matrix multiply. Tensor cores are used to perform much larger two-dimensional or higher dimensional matrix operations, built up from these smaller elements, in an embodiment. In an embodiment, an API, such as CUDA 9 C++ API, exposes specialized matrix load, matrix multiply and accumulate, and matrix store operations to efficiently use tensor cores from a CUDA-C++ program. In an embodiment, at the CUDA level, the warp-level interface assumes 16×16 size matrices spanning all 32 threads of the warp.

In an embodiment, each SM 1100 comprises M SFUs 1112 that perform special functions (e.g., attribute evaluation, reciprocal square root, and the like). In an embodiment, the SFUs 1112 include a tree traversal unit configured to traverse a hierarchical tree data structure. In an embodiment, the SFUs 1112 include texture unit configured to perform texture map filtering operations. In an embodiment, the texture units are configured to load texture maps (e.g., a 2D array of texels) from the memory and sample the texture maps to produce sampled texture values for use in shader programs executed by the SM 1100. In an embodiment, the texture maps are stored in the shared memory/L1 cache. The texture units implement texture operations such as filtering operations using mip-maps (e.g., texture maps of varying levels of detail), in accordance with one embodiment. In an embodiment, each SM 1100 includes two texture units.

Each SM 1100 comprises N LSUs 1054 that implement load and store operations between the shared memory/L1 cache 1006 and the register file 1108, in an embodiment. Each SM 1100 includes an interconnect network 1116 that connects each of the functional units to the register file 1108 and the LSU 1114 to the register file 1108, shared memory/ L1 cache 1118 in an embodiment. In an embodiment, the interconnect network 1116 is a crossbar that can be configured to connect any of the functional units to any of the registers in the register file 1108 and connect the LSUs 1114 to the register file and memory locations in shared memory/ L1 cache 1118.

The shared memory/L1 cache 1118 is an array of on-chip memory that allows for data storage and communication between the SM 1100 and the primitive engine and between threads in the SM 1100 in an embodiment. In an embodiment, the shared memory/L1 cache 1118 comprises 128 KB of storage capacity and is in the path from the SM 1100 to the partition unit. The shared memory/L1 cache 1118, in an embodiment, is used to cache reads and writes. One or more of the shared memory/L1 cache 1118, L2 cache, and memory are backing stores.

Combining data cache and shared memory functionality into a single memory block provides improved performance for both types of memory accesses, in an embodiment. The capacity, in an embodiment, is used or is usable as a cache by programs that do not use shared memory, such as if shared memory is configured to use half of the capacity, texture and load/store operations can use the remaining capacity. Integration within the shared memory/L1 cache 1118 enables the shared memory/L1 cache 1118 to function as a high-throughput conduit for streaming data while simultaneously providing high-bandwidth and low-latency access to frequently reused data, in accordance with an embodiment. When configured for general purpose parallel computation, a simpler configuration can be used compared with graphics processing. In an embodiment, fixed function graphics processing units are bypassed, creating a much simpler programming model. In the general purpose parallel computation configuration, the work distribution unit assigns and distributes blocks of threads directly to the DPCs, in an embodiment. The threads in a block execute the same program, using a unique thread ID in the calculation to ensure each thread generates unique results, using the SM 1100 to execute the program and perform calculations, shared memory/L1 cache 1118 to communicate between threads, and the LSU 1114 to read and write global memory through the shared memory/L1 cache 1118 and the memory partition unit, in accordance with one embodiment. In an embodiment, when configured for general purpose parallel computation, the SM 1100 writes commands that the scheduler unit can use to launch new work on the DPCs.

In an embodiment, the PPU is included in or coupled to a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, and more. In an embodiment, the PPU is embodied on a single semiconductor substrate. In an embodiment, the PPU is included in a system-on-a-chip ("SoC") along with one or more other devices such as additional PPUs, the memory, a reduced instruction set computer ("RISC") CPU, a memory management unit ("MMU"), a digital-to-analog converter ("DAC"), and the like.

In an embodiment, the PPU may be included on a graphics card that includes one or more memory devices. The graphics card may be configured to interface with a PCIe slot on a motherboard of a desktop computer. In yet another embodiment, the PPU may be an integrate graphics processing unit ("iGPU") included in the chipset of the motherboard.

Figure 12:
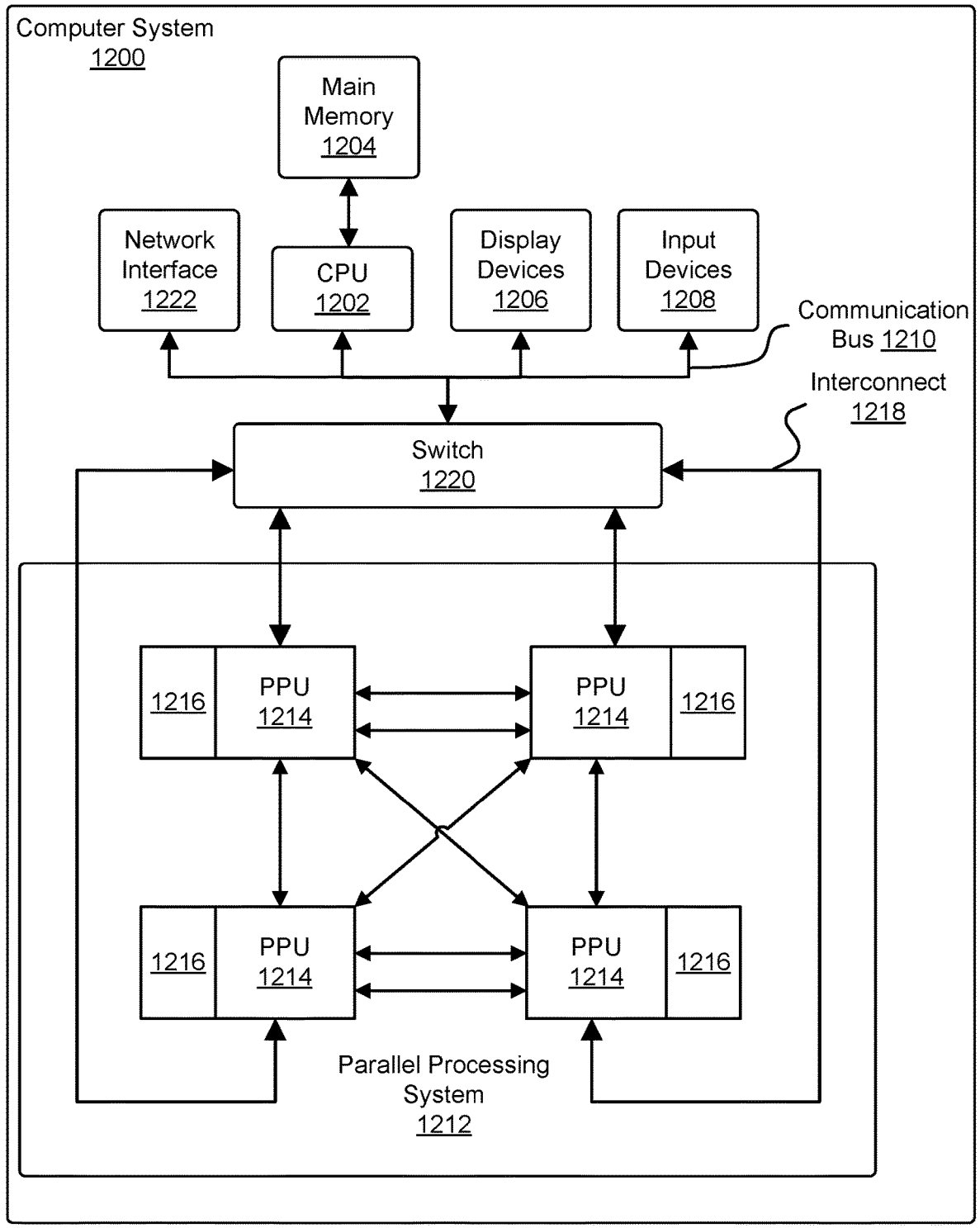
FIG. 12 illustrates a computer system in which the various examples can be implemented, in accordance with an embodiment.

FIG. 12 illustrates a computer system 1200 in which the various architecture and/or functionality can be implemented, in accordance with one embodiment. The computer system 1200, in an embodiment, is configured to implement various processes and methods described throughout this disclosure.

In an embodiment, the computer system 1200 comprises at least one central processing unit 1202 that is connected to a communication bus 1210 implemented using any suitable protocol, such as PCI (Peripheral Component Interconnect), PCI-Express, AGP (Accelerated Graphics Port), Hyper-Transport, or any other bus or point-to-point communication protocol(s). In an embodiment, the computer system 1200 includes a main memory 1204 and control logic (e.g., implemented as hardware, software, or a combination thereof) and data are stored in the main memory 1204 which may take the form of random access memory ("RAM"). In an embodiment, a network interface subsystem 1222 provides an interface to other computing devices and networks for receiving data from and transmitting data to other systems from the computer system 1200.

The computer system 1200, in an embodiment, includes input devices 1208, the parallel processing system 1212, and display devices 1206 which can be implemented using a conventional CRT (cathode ray tube), LCD (liquid crystal display), LED (light emitting diode), plasma display, or other suitable display technologies. In an embodiment, user input is received from input devices 1208 such as keyboard, mouse, touchpad, microphone, and more. In an embodiment, each of the foregoing modules can be situated on a single semiconductor platform to form a processing system.

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit ("CPU") and bus implementation. Of course, the various modules may also be situated separately or in various combinations of semiconductor platforms per the desires of the user.

In an embodiment, computer programs in the form of machine-readable executable code or computer control logic algorithms are stored in the main memory 1204 and/or secondary storage. Computer programs, if executed by one or more processors, enable the system 1200 to perform various functions in accordance with one embodiment. The memory 1204, the storage, and/or any other storage are possible examples of computer-readable media. Secondary storage may refer to any suitable storage device or system such as a hard disk drive and/or a removable storage drive, representing a floppy disk drive, a magnetic tape drive, a compact disk drive, digital versatile disk ("DVD") drive, recording device, universal serial bus ("USB") flash memory.

In an embodiment, the architecture and/or functionality of the various previous figures are implemented in the context of the central processor 1202; parallel processing system 1212; an integrated circuit capable of at least a portion of the capabilities of both the central processor 1202; the parallel processing system 1212; a chipset (e.g., a group of integrated circuits designed to work and sold as a unit for performing related functions, etc.); and any suitable combination of integrated circuit.

In an embodiment, the architecture and/or functionality of the various previous figures is be implemented in the context of a general computer system, a circuit board system, a game console system dedicated for entertainment purposes, an application-specific system, and more. In an embodiment, the computer system 1200 may take the form of a desktop computer, a laptop computer, a tablet computer, servers, supercomputers, a smart-phone (e.g., a wireless, hand-held device), personal digital assistant ("PDA"), a digital camera, a vehicle, a head mounted display, a hand-held electronic device, a mobile phone device, a television, workstation, game consoles, embedded system, and/or any other type of logic.

In an embodiment, a parallel processing system 1212 includes a plurality of PPUs 1214 and associated memories 1216. In an embodiment, the PPUs are connected to a host processor or other peripheral devices via an interconnect 1218 and a switch 1220 or multiplexer. In an embodiment, the parallel processing system 1212 distributes computational tasks across the PPUs 1214 which can be parallelizable—for example, as part of the distribution of computational tasks across multiple GPU thread blocks. In an embodiment, memory is shared and accessible (e.g., for read and/or write access) across some or all of the PPUs 1214, although such shared memory may incur performance penalties relative to the use of local memory and registers resident to a PPU. In an embodiment, the operation of the PPUs 1214 is synchronized through the use of a command such as _syncthreads( ) which requires all threads in a block (e.g., executed across multiple PPUs 1214) to reach a certain point of execution of code before proceeding.

The specification and drawings are, accordingly, to be regarded in an illustrative rather than a restrictive sense. It will, however, be evident that various modifications and changes may be made thereunto without departing from the broader spirit and scope of the invention as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed, but on the contrary, the intention is to cover all modifications, alternative constructions, and equivalents falling within the spirit and scope of the invention, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. The use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). The number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In an embodiment, a process such as those processes described herein (or variations and/or combinations thereof) is performed under the control of one or more computer systems configured with executable instructions and is implemented as code (e.g., executable instructions, one or more computer programs or one or more applications) executing collectively on one or more processors, by hardware or combinations thereof. In an embodiment, the code is stored on a computer-readable storage medium, for example, in the form of a computer program comprising a plurality of instructions executable by one or more processors. In an embodiment, a machine-readable medium or a computer-readable storage medium is a non-transitory machine-readable medium or a computer-readable storage medium that excludes transitory signals (e.g., a propagating transient electric or electromagnetic transmission) but includes non-transitory data storage circuitry (e.g., buffers, cache, and queues) within transceivers of transitory signals. In an embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause the computer system to perform operations described herein. In an embodiment, the set of one or more non-transitory computer-readable storage media or machine-readable medium comprises information, which if used by one or more computer instructions, configures one or more processors of a computer system and further causes the one or more processors to perform operations described herein. The set of non-transitory computer-readable storage media, in an embodiment, comprises multiple non-transitory computer-readable storage media and one or more of individual non-transitory storage media of the multiple non-transitory computer-readable storage media lack all of the code while the multiple non-transitory computer-readable storage media collectively store all of the code. In an embodiment, the executable instructions are executed such that different instructions are executed by different processors—for example, a non-transitory computer-readable storage medium store instructions and a main CPU execute some of the instructions while a graphics processor unit executes other instructions. In an embodiment, different components of a computer system have separate processors and different processors execute different subsets of the instructions.

Accordingly, in an embodiment, computer systems are configured to implement one or more services that singly or collectively perform operations of processes described herein and such computer systems are configured with applicable hardware and/or software that enable the performance of the operations. Further, a computer system that implement an embodiment of the present disclosure is a single device and, in another embodiment, is a distributed computer system comprising multiple devices that operate differently such that the distributed computer system performs the operations described herein and such that a single device does not perform all operations.

The use of any and all examples, or exemplary language (e.g., "such as") provided herein, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described herein, including the best mode known to the inventors for carrying out the invention. Variations of those embodiments may become apparent to those of ordinary skill in the art upon reading the foregoing description. The inventors expect skilled artisans to employ such variations as appropriate and the inventors intend for embodiments of the present disclosure to be practiced otherwise than as specifically described herein. Accordingly, the scope of the present disclosure includes all modifications and equivalents of the subject matter recited in the claims appended hereto as permitted by applicable law. Moreover, any combination of the above-described elements in all possible variations thereof is encompassed by the scope of the present disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

In the description and claims, the terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout the specification terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. As non-limiting examples, "processor" may be a Central Processing Unit (CPU) or a Graphics Processing Unit (GPU). A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. The terms "system" and "method" are used herein interchangeably insofar as the system may embody one or more methods and the methods may be considered a system.

In the present document, references may be made to obtaining, acquiring, receiving, or inputting analog or digital data into a subsystem, computer system, or computer-implemented machine. The process of obtaining, acquiring, receiving, or inputting analog and digital data can be accomplished in a variety of ways such as by receiving the data as a parameter of a function call or a call to an application programming interface. In some implementations, the process of obtaining, acquiring, receiving, or inputting analog or digital data can be accomplished by transferring the data via a serial or parallel interface. In another implementation, the process of obtaining, acquiring, receiving, or inputting analog or digital data can be accomplished by transferring the data via a computer network from the providing entity to the acquiring entity. References may also be made to providing, outputting, transmitting, sending, or presenting analog or digital data. In various examples, the process of providing, outputting, transmitting, sending, or presenting analog or digital data can be accomplished by transferring the data as an input or output parameter of a function call, a parameter of an application programming interface or interprocess communication mechanism.

Although the discussion above sets forth example implementations of the described techniques, other architectures may be used to implement the described functionality, and are intended to be within the scope of this disclosure. Furthermore, although specific distributions of responsibilities are defined above for purposes of discussion, the various functions and responsibilities might be distributed and divided in different ways, depending on circumstances.

Furthermore, although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. A processor, comprising:
    one or more circuits to compress information, wherein the one or more circuits are to:
        identify a first common value within each value of a first set of values;
        identify a second common value within each value of one or more subsets of values of the first set of values; and
        store compressed information comprising a third value corresponding to a mathematical relationship between the first and second common values and each value within the one or more subsets of values.

2. The processor of claim 1, wherein the first set of values is a uniform grid of non-overlapping tiles from a matrix of floating point numbers.

3. The processor of claim 2, wherein each subset of the one or more subsets of values is a smaller uniform grid of non-overlapping tiles from the first set of values.

4. The processor of claim 1, wherein the first common value is identified from a compressed set of the first set of values and second common value is identified from a second compressed set of the one or more subsets of values.

5. The processor of claim 4, wherein the third value includes information for the processor to decompress the compressed set of the first set of values.

6. The processor of claim 1, wherein the third value is stored in a storage device without having to store the second common value.

7. The processor of claim 6, wherein the third value is stored in the storage device as an unsigned integer that does not exceed a predetermined amount of bits.

8. A method, comprising:
    identifying a first common value within each value of a first set of values;
    identifying a second common value within each value of one or more subsets of values of the first set of values; and
    storing compressed information comprising a third value corresponding to an indication of how to determine a mathematical relationship between the first and second common values and each value within the one or more subsets of values.

9. The method of claim 8, wherein the first common value is identified from a compressed set of the first set of values and second common value is identified from a second compressed set of the one or more subsets of values, wherein the third value and the compressed set of the first set of values are used to train a neural network.

10. The method of claim 8, wherein the indication is a difference value between the second common value and the first common value.

11. The method of claim 8, wherein the first set of values is a data set of elements of a matrix of floating point numbers, wherein bits of each of the floating point numbers represent an exponent value.

12. The method of claim 11, wherein identifying the first common value further comprises identifying a first maximum exponent value that is common to the first set of values.

13. The method of claim 12, wherein after identifying the first maximum exponent value, the method further comprises identifying the second common value by identifying a second maximum exponent value common to the one or more subsets of values.

14. A machine-readable medium having stored thereon a set of instructions, which if performed by one or more processors, cause the one or more processors to at least:
    identify a first common value within each value of a first set of values;
    identify a second common value within each value of one or more subsets of values of the first set of values; and
    store compressed information comprising a third value corresponding to a mathematical relationship between the first and second common values and each value within the one or more subsets of values.

15. The machine-readable medium of claim 14, wherein the first common value is stored and the second common value is not stored.

16. The machine-readable medium of claim 14, wherein the third value is a difference value between the first and second common values.

17. The machine-readable medium of claim 16, wherein the difference value is a proxy to identify the second common value from the first common value.

18. The machine-readable medium of claim 16, wherein the difference value has at least the same or fewer bits than the second common value.

19. The machine-readable medium of claim 14, wherein the set of instructions further includes instructions, which if performed by the one or more processors, cause the one or more processors to compress the first set of values to identify the first common value.

20. The machine-readable medium of claim 14, wherein the set of instructions further includes instructions, which if performed by the one or more processors, cause the one or more processors to compress the one or more subsets of values to identify the second common value.

21. A machine-readable medium having stored thereon a set of instructions, which if performed by one or more processors, cause the one or more processors to compress a data set by initially compressing the data set to determine a first value, then compressing a subset of the data set by replacing elements of the subset with smaller elements and storing a second value, wherein the second value indicates how to calculate the replaced elements based at least in part on the smaller elements and the first value.

22. The machine-readable medium of claim 21, wherein the data set comprises a matrix of floating point numbers.

23. The machine-readable medium of claim 21, wherein the first value is determined by subtracting a common exponent value associated with all values of a first set of values within the data set from an exponent of each value of the first set of values.

24. The machine-readable medium of claim 21, wherein the second value is determined subtracting a common exponent value associated with all values of the subset of the data set from an exponent of each value of the subset.

25. The machine-readable medium of claim 21, wherein the second value uses less storage than the first value.

* * * * *